(12) United States Patent
Yamauchi et al.

(10) Patent No.: US 9,667,262 B2
(45) Date of Patent: May 30, 2017

(54) DIGITAL CONTROL OSCILLATOR CIRCUIT

(71) Applicant: DENSO CORPORATION, Kariya, Aichi-pref. (JP)

(72) Inventors: Shigenori Yamauchi, Kariya (JP); Nobuyuki Taguchi, Kariya (JP); Takamoto Watanabe, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/189,017

(22) Filed: Jun. 22, 2016

(65) Prior Publication Data

US 2017/0012632 A1    Jan. 12, 2017

(30) Foreign Application Priority Data

Jul. 8, 2015  (JP) .................... 2015-137103

(51) Int. Cl.
| H03K 3/03 | (2006.01) |
|---|---|
| H03L 7/099 | (2006.01) |
| H03L 7/091 | (2006.01) |
| H03L 7/197 | (2006.01) |
| H03K 23/50 | (2006.01) |
| G06F 1/12 | (2006.01) |

(Continued)

(52) U.S. Cl.
CPC .......... H03L 7/0997 (2013.01); G04F 10/005 (2013.01); G06F 1/12 (2013.01); H03K 3/0315 (2013.01); H03K 5/135 (2013.01); H03K 23/425 (2013.01); H03K 23/502 (2013.01); H03L 7/091 (2013.01); H03L 7/1974 (2013.01)

(58) Field of Classification Search
CPC ..... H03L 7/0997; H03L 7/091; H03L 7/1974; H03K 23/502; H03K 23/425; H03K 3/0315; H03K 5/135; G06F 1/12; G04F 10/005
USPC ............... 331/1 A, 57; 327/159; 375/373
See application file for complete search history.

(56) References Cited

U.S. PATENT DOCUMENTS 5,465,076 A * 11/1995 Yamauchi ............ H03K 3/0315
                                                     327/277
5,477,196 A    12/1995 Yamauchi et al.
(Continued)

FOREIGN PATENT DOCUMENTS

| JP | H07-183800 A | 7/1995 |
|---|---|---|
| JP | H10-054887 A | 2/1998 |

*Primary Examiner* — Arnold Kinkead
(74) *Attorney, Agent, or Firm* — Harness, Dickey & Pierce, P.L.C.

(57) ABSTRACT

A digital control oscillator circuit includes: a ring oscillator having delay elements delaying a pulse signal; a counter circuit counting the circulation number of the pulse signal; a rough period generation unit acquiring a period setting value as a magnification ratio for a reference clock, and counting the reference clock using an integer part of the ratio to generate a rough period timing; a fraction conversion unit converting a decimal point part of the ratio into the number of the elements passed by the pulse signal to generate a fraction; and an output processing unit selecting a timing when outputs of the ring oscillator and the counter circuit become values corresponding to the fraction as an output timing when a time corresponding to the fraction has passed after the rough period timing, and generating an output signal oscillating at a period represented by the period setting value according to the output timing.

5 Claims, 22 Drawing Sheets

(51) Int. Cl.
*H03K 23/42* (2006.01)
*H03K 5/135* (2006.01)
*G04F 10/00* (2006.01)

(56) References Cited

U.S. PATENT DOCUMENTS

| | | | |
|---|---|---|---|
| 5,818,797 A | 10/1998 | Watanabe et al. | |
| 2009/0251225 A1* | 10/2009 | Chen | H03K 3/03 331/1 A |
| 2016/0041529 A1* | 2/2016 | Yamauchi | G04F 10/005 702/176 |
| 2016/0118990 A1* | 4/2016 | Faisal | H03K 5/134 327/156 |

* cited by examiner

FIG. 7

BOUNDARY FRACTION OPE

| PATTERN | COMPARISON | | | OUTPUT | |
|---|---|---|---|---|---|
| | DR>DKB | DR>DK | DK>DKB | SUB | PM1 |
| DKB<DR<DK | 1 | 0 | 1 | DK-DR | 0 (NORMAL DET STATE) |
| DR<DK<DKB | 0 | 0 | 0 | | |
| DK<DKB<DR | 1 | 1 | 0 | | |
| DR<DKB<DK | 0 | 0 | 1 | DKB-DR | 1 (DELAYED DET STATE) |
| DKB<DK<DR | 1 | 1 | 1 | | |
| DK<DR<DKB | 0 | 1 | 0 | | |

PER FRACTION OPE

| PATTERN | COMPARISON | |
| --- | --- | --- |
| | RCH | PM2 |
| SUB_B>=SUB | SUB_B-SUB | 0 |
| SUB_B<SUB | SCW-(SUB-SUB_B) | 1 |

COUNT VAL COR

| PATTERN | | | RCC |
|---|---|---|---|
| PM1 | PM1_B | PM2 | |
| 0 | 0 | 0 | CT |
| 0 | 1 | 0 | CT+1 |
| 1 | 0 | 0 | CT-1 |
| 1 | 1 | 0 | CT |
| 0 | 0 | 1 | CT-1 |
| 0 | 1 | 1 | CT |
| 1 | 0 | 1 | CT-2 |
| 1 | 1 | 1 | CT-1 |

US 9,667,262 B2

DIGITAL CONTROL OSCILLATOR CIRCUIT

CROSS REFERENCE TO RELATED APPLICATION

This application is based on Japanese Patent Application No. 2015-137103 filed on Jul. 8, 2015, the disclosure of which is incorporated herein by reference.

TECHNICAL FIELD

The present disclosure relates to a digital control oscillator circuit for generating a clock having a desired period using a ring oscillator.

BACKGROUND

There has been conventionally known a technique that counts a period of a reference clock with a stable frequency generated using, for example, a crystal oscillator by a high-speed clock signal, and generates a clock signal by multiplying or dividing the period of the reference clock on the basis of the count value (refer to Patent Literature 1, for example). In this technique, a high-speed clock is generated by a ring oscillator including a plurality of delay elements which delay a pulse signal and are connected in a ring shape. Further, the high-speed clock generated by the ring oscillator is counted to generate a clock signal as output.

A delay time of each delay element included in a ring oscillator fluctuates by, for example, fluctuation of power supply voltage or thermal noise, and fluctuations are accumulated by the number of passed delay elements. Thus, in prior art, as the period of a clock signal to be output increases, the fluctuation of the period disadvantageously increases.

Patent Literature 1: JP-H7-183800-A (corresponding to U.S. Pat. No. 5,477,196)

SUMMARY

It is an object of the present disclosure to provide a digital control oscillator circuit for generating a clock having a stable accuracy regardless of the length of the period.

According to an aspect of the present disclosure, a digital control oscillator circuit includes: a ring oscillator having a plurality of delay elements that delay a pulse signal and are connected in series in a ring shape; a counter circuit that counts the number of circulations of the pulse signal in the ring oscillator; a rough period generation unit that: acquires a period setting value represented as a magnification ratio with respect to a period of a predetermined reference clock; counts the reference clock using an integer part of the magnification ratio as a count value; and generates a rough period timing of each period represented by the integer part; a fraction conversion unit that converts a decimal point part of the magnification ratio into the number of stages of the delay elements passed by the pulse signal, and generates a fraction; and an output processing unit that: selects a timing when each of an output of the ring oscillator and an output of the counter circuit becomes a value corresponding to the fraction generated by the fraction conversion unit as an output timing when a time corresponding to the fraction has passed after the rough period timing; and generates an output signal oscillating at a period represented by the period setting value according to the output timing.

According to such a configuration, the rough period timing corresponding to the integer part of the period setting value is generated on the basis of the reference clock having an accurate period, and a fine timing corresponding to the decimal point part of the period setting value is generated on the basis of the outputs of the ring oscillator and the counter circuit. An output timing required for the generation of an output signal can be obtained by combining both the rough frequency timing and the fine timing. Thus, it is possible to minimize the accumulation of fluctuations included in outputs of the respective delay elements of the ring oscillator and, in turn, to reduce the fluctuation of the period of the final output signal. Accordingly, it is possible to obtain an output signal having a high accuracy, that is, a clock that oscillates at a period represented by the period setting value.

BRIEF DESCRIPTION OF THE DRAWINGS

The above and other objects, features and advantages of the present disclosure will become more apparent from the following detailed description made with reference to the accompanying drawings. In the drawings:

FIG. 7 is a table illustrating processing contents in a fraction operation execution unit;

FIGS. 8A and 8B are explanatory diagrams regarding setting contents of the table illustrated in FIG. 7, wherein FIG. 8A illustrates a timing in a normal detection state and FIG. 8B illustrates a timing in a delayed detection state;

FIGS. 11A and 11B are explanatory diagrams regarding setting contents of the table illustrated in FIG. 10, wherein FIG. 11A illustrates a case in which the preceding fraction is larger than the following fraction and FIG. 11B illustrates a case in which the preceding fraction is smaller than the following fraction;

FIGS. 14A to 14D are explanatory diagrams regarding setting contents of the table illustrated in FIG. 13, wherein FIG. 14A illustrates a case of PM1_B=0 and PM1=0, FIG. 14B illustrates a case of PM1_B=1 and PM1=0, FIG. 14C illustrates a case of PM1_B=0 and PM1=1, and FIG. 14D illustrates a case of PM1_B=1 and PM1=1;

FIG. 24 is a timing chart illustrating the operation of the output position count value operation unit, the output processing unit and the like;

DETAILED DESCRIPTION

1. Entire Configuration

Figure 1:
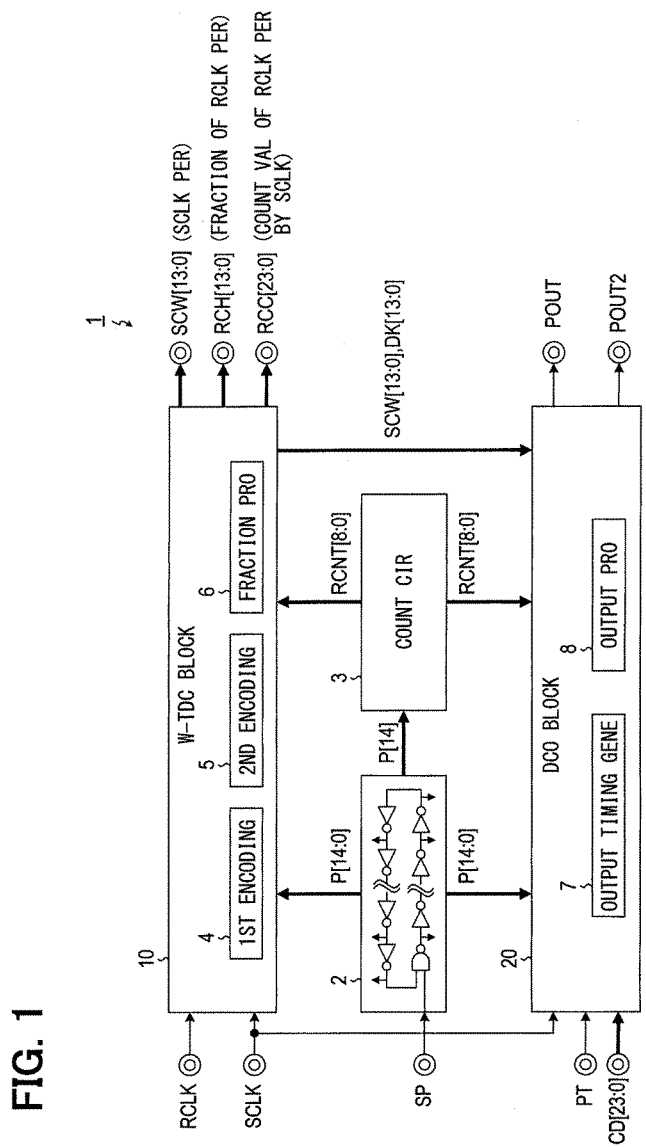
FIG. 1 is a block diagram illustrating the configuration of a W-TDC-DCO.

A W-TDC-DCO 1 illustrated in FIG. 1 includes a ring oscillator 2, a counter circuit 3, a W-TDC block 10, and a DCO block 20. The ring oscillator 2, the counter circuit 3, and the W-TDC block 10 constitute a time measurement circuit (TDC) 1a. The ring oscillator 2, the counter circuit 3, and the DCO block 20 constitute a digital control oscillator circuit (DCO) 1b. That is, the time measurement circuit 1a and the digital control oscillator circuit 1b share the ring oscillator 2 and the counter circuit 3.

2. Ring Oscillator

The ring oscillator 2 uses an odd number of inverter circuits (fifteen inverter circuits in the present embodiment) as delay elements. The inverter circuits are connected in series and the last stage output is defined as the first stage input, so that the inverter circuits are connected in a ring shape. The first stage inverter circuit includes a 2-input NAND gate, and the other inverter circuits include inverter gates. An input end of the NAND gate that is not used for the ring-shaped connection is connected to an input terminal for inputting an activation signal SP from the outside. Hereinbelow, outputs of the ring oscillator 2 are collectively denoted by P [14:0]. Further, the output of each of the inverter circuits is denoted by P [i] (i=0 to 14), the output of the first stage inverter circuit is denoted by P [0], and the outputs thereafter are denoted by P [1] to P [14] in accordance with the connecting order of the inverter circuits.

In the ring oscillator 2 configured in this manner, when the activation signal SP is at a low level, the output P [0] of the first stage inverter circuit is constantly at a high level regardless of a signal level of the output P [14] of the last stage inverter circuit. Thus, all the outputs P [0] to P [14] do not change and become a stopped state. The output P [14] in a stopped sate is at a high level. When a high level of the activation signal SP is maintained after an activation timing when the activation signal SP changes from a low level to a high level, the output P [0] of the first stage inverter circuit is inverted from a high level to a low level. Thereafter, the output of each of the inverter circuits is inverted with a delay, and the output P [14] changes to a low level. Accordingly, the output P [0] of the first stage inverter circuit changes to a high level, so that an inverted edge of the signal level continuously circulates. The inverted edge includes an edge that changes from a low level to a high level and an edge that changes from a high level to a low level. In any one output P [i], when one of the inverted edges is defined as a head edge, a pulse signal is output every time the inverted edge makes two rounds, that is, at a period of a delay time of 30 stages of the inverter circuits.

3. Counter Circuit

The counter circuit 3 is a 9-bit counter which operates using the output P [14] of the ring oscillator 2 as a count clock. Counting-up is performed at a timing when the output P [14] changes from a low level to a high level. Thus, a count value of the counter circuit 3 is incremented by one every time a pulse signal passes 30 stages of the inverter circuits. When counting-up is performed with the count value reaching the maximum value, the count value returns to zero, and the count operation is continued thereafter. Hereinbelow, the output of the counter circuit 3 is denoted by RCNT [8:0].

4. W-TDC Block

Figure 2:
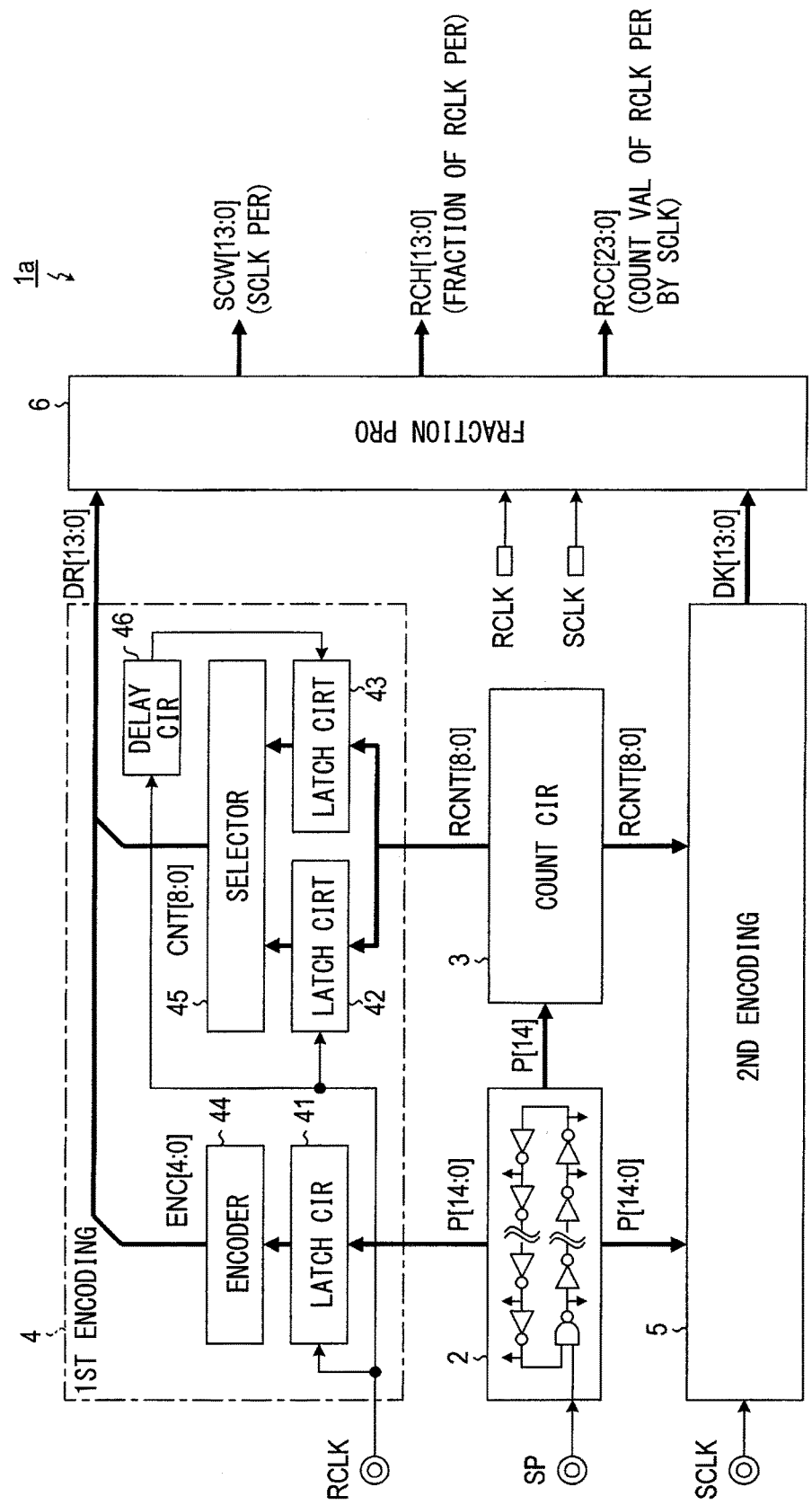
FIG. 2 is a block diagram illustrating the configuration of a time measurement circuit (W-TDC)

The W-TDC block 10 includes a first encoding unit 4, a second encoding unit 5, and a fraction processing unit 6. As illustrated in FIG. 2, the W-TDC block 10 constitutes the time measurement circuit is together with the ring oscillator 2 and the counter circuit 3 described above.

4.1. First Encoding Unit

The first encoding unit 4 includes latch circuits 41, 42, 43, an encoder 44, a selector 45, and a delay circuit 46. Although the first encoding unit 4 is a known technique (refer to JP-H7-183800-A, for example), the outline thereof will be described.

The latch circuit 41 latches the output P [14:0] of the ring oscillator 2 at the timing of a rising edge of a measurement target clock RCLK input from the outside. The latch circuit 42 latches the output RCNT [8:0] of the counter circuit 3 also at the timing of the rising edge of the measurement target clock RCLK. The latch circuit 43 latches the output RCNT [8:0] of the counter circuit 3 at a timing delayed by a half period from the measurement target clock RCLK by the delay circuit 46.

The encoder 44 specifies a part where the input and output of the inverter circuit of the ring oscillator 2 are at the same signal level from a result latched by the latch circuit 41, and performs encoding into a binary number representing a value of 0 to 30 in accordance with the position of the specified inverter circuit and the same signal level (high level or low level). Hereinbelow, the output of the encoder 44 is denoted by ENC [4:0].

In accordance with a value of the most significant bit output ENC [4] of the encoder 44, the selector 45 selects the output of the latch circuit 42 when ENC [4]=1 and selects the output of the latch circuit 43 when ENC [4]=0. Hereinbelow, the output selected by the selector 45 is denoted by CNT [8:0]. Any of the outputs latched at different timings is selectively used in this manner to prevent a count value latched in an unstable state from being supplied to the post-stage processing.

The first encoding unit 4 supplies a first measurement output DR [13:0] which is 14-bit data in total including the output ENC [4:0] of the encoder 44 as lower-order bits and the output CNT [8:0] of the selector 45 as higher-order bits to the fraction processing unit 6 at the timing of each rising edge of the measurement target clock RCLK.

4.2. Second Encoding Unit

The second encoding unit 5 has a configuration similar to the configuration of the first encoding unit 4. Thus, description of the details of the second encoding unit 5 will be omitted. However, in the second encoding unit 5, a reference clock SCLK is input instead of the measurement target clock RCLK, and a second measurement output DK [13:0] is supplied to the fraction processing unit 6 at the timing of each rising edge of the reference clock SCLK instead of the first measurement outputs DR [13:0].

The reference clock SCLK is a highly stable clock which is generated by, for example, the output of a crystal oscillator. A period of the reference clock SCLK is set at approximately several tens to several hundred times a delay time of each of the inverter circuits of the ring oscillator 2 (approximately 100 ns, for example). The period of the reference clock SCLK and the bit width of the output of the counter circuit 3 are set so that a time corresponding to the maximum value that can be represented by the first measurement output DR [13:0] and the second measurement output DK [13:0] becomes twice the period of the reference clock SCLK or more. Further, the period of the reference clock SCLK is set to be sufficiently shorter than the period of the measurement target clock RCLK (1/100 or less, for example). Hereinbelow, the first measurement output DR [13:0] and the second measurement output DK [13:0] are also merely denoted by DR, DK. The same applies to another reference sign that represents a plurality of bits.

4.3. Fraction Processing Unit

Figure 3:
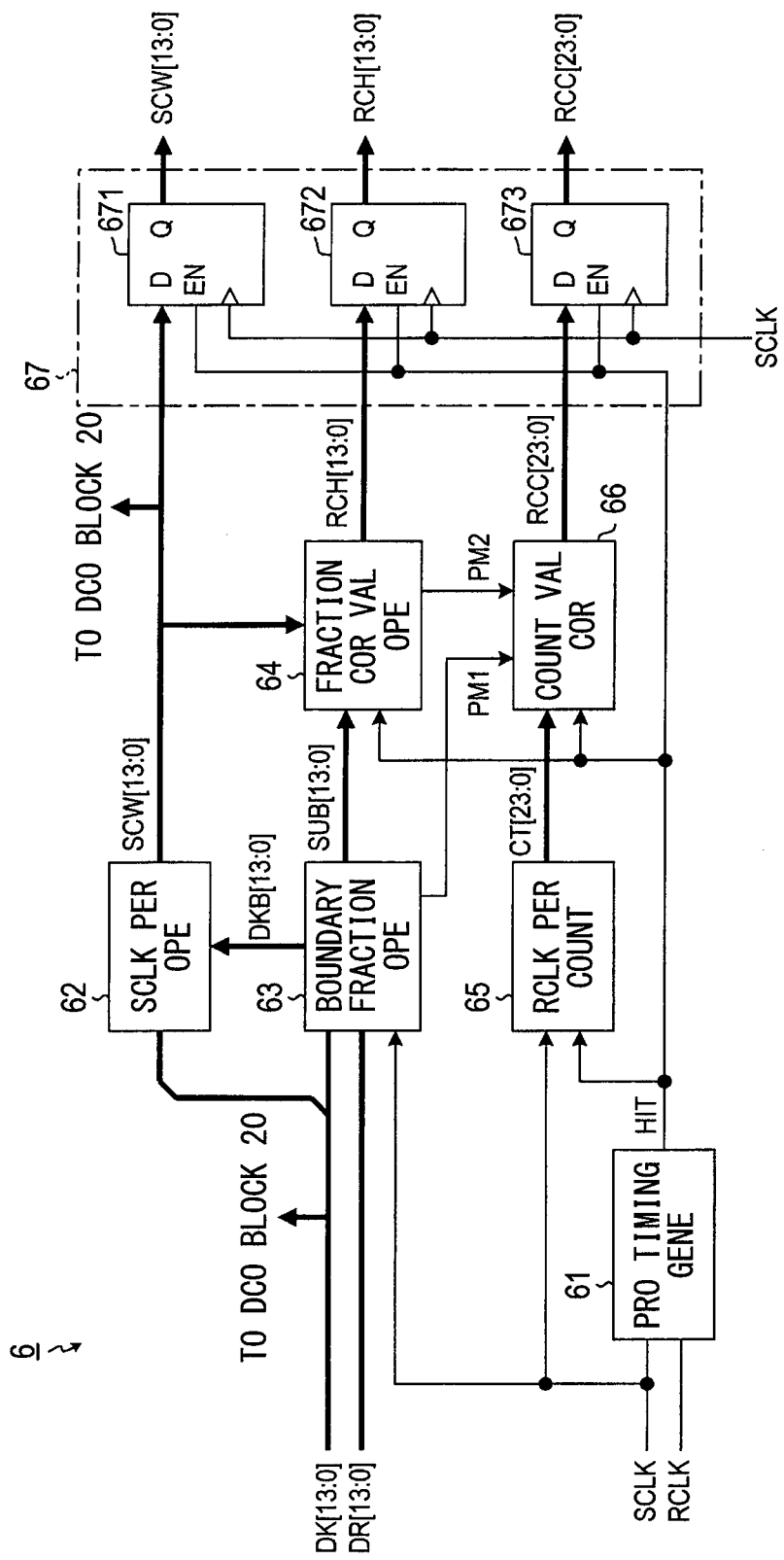
FIG. 3 is a block diagram illustrating the configuration of a fraction processing unit.

As illustrated in FIG. 3, the fraction processing unit 6 includes a processing timing generation unit 61, an SCLK period operation unit 62, a boundary fraction operation unit 63, a fraction correction value operation unit 64, an RCLK period count unit 65, a count value correction unit 66, and an output unit 67.

4.3.1. Processing Timing Generation Unit

Figure 4:
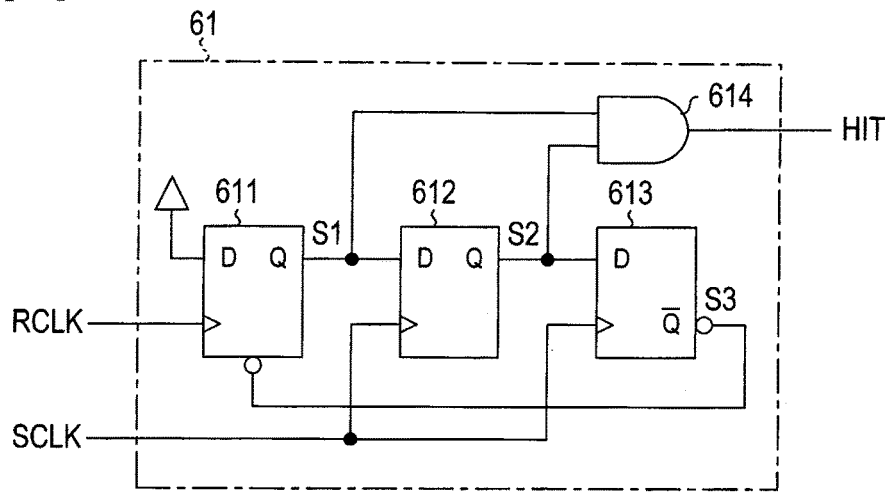
FIG. 4 is a circuit diagram illustrating the configuration of a processing timing generation unit.

As illustrated in FIG. 4, the processing timing generation unit 61 includes latch circuits 611, 612, 613 and an AND gate 614. An output S1 of the latch circuit 611 changes to a high level at the timing of the rising edge of the measurement target clock RCLK (hereinbelow, referred to as "RCLK timing"). The latch circuit 612 latches a signal level of the output S1 to generate an output S2 at the timing of the rising edge of the reference clock SCLK (hereinbelow, referred to as "SCLK timing"). The latch circuit 613 latches a signal level of the output S2 at the SCLK timing and generates an output S3 by inverting the latched signal level. The output S3 is input to a rest terminal of the latch circuit 611 to reset the output S1 of the latch circuit 611 to a low level when the output S3 is at a low level. The AND gate 614 outputs a high level when both the outputs S1, S2 are at a high level. The output of the AND gate 614 is supplied to each unit as a processing timing signal HIT.

Figure 5:
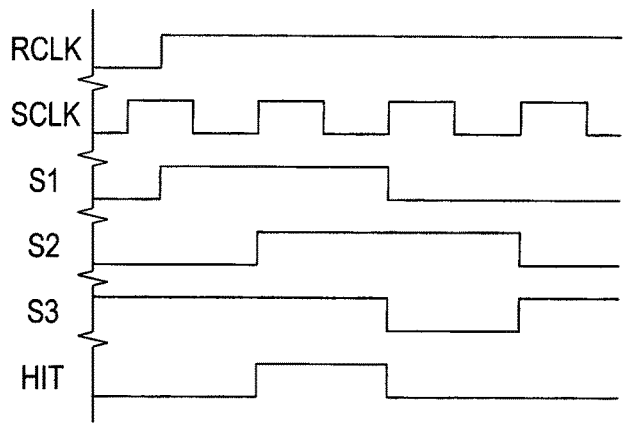
FIG. 5 is a timing chart illustrating the operation of the processing timing generation unit.

As illustrated in FIG. 5, in the processing timing generation unit 61 configured in this manner, the output S1 changes from a low level to a high level at the RCLK timing. Then, the output S2 changes from a low level to a high level at the first SCLK timing, and the processing timing signal HIT also changes from a low level to a high level along with the change of the output S2. At the following SCLK timing, the output S3 changes from a high level to a low level. The latch circuit 611 is reset along with the change of the output S3. Accordingly, the output S1 changes from a high level to a low level, and the processing timing signal HIT also changes from a high level to a low level. At the following SCLK timing, the output S2 changes from a high level to a low level, and the output S3 changes from a low level to a high level. Thereafter, this state is maintained until the RCLK timing again appears.

That is, every time the RCLK timing is detected, the processing timing signal HIT generated by the processing timing generation unit 61 changes to a high level at an SCLK timing immediately after the detected RCLK timing and further changes to a low level at the next SCLK timing. That is, the high level of the processing timing signal HIT is maintained for one period of the reference clock SCLK. Hereinbelow, the period is also referred to as a processing target period. However, the measurement target clock RCLK and the reference clock SCLK asynchronously operate. Thus, when a period between the RCLK timing and the first SCLK timing is short, the output S2 may not be able to change at the first SCLK timing and may change to a high level at the next SCLK timing. Thus, in this case, the processing timing signal HIT is maintained at a high level for a period between the second SCLK timing and the third SCLK timing after the detection of the RCLK timing. Hereinbelow, a case in which the processing timing signal HIT becomes a high level at the first SCLK timing after the detection of the RCLK timing is referred to as "normal detection state", and a case in which the processing timing signal HIT becomes a high level at the second SCLK timing after the detection of the RCLK timing is referred to as "delayed detection state".

4.3.2. RCLK Period Count Unit

Referring back to FIG. 3, at each rising edge of the processing timing signal HIT, the RCLK period count unit 65 outputs a count value counted by the reference clock SCLK in a period between the preceding rising edge and the current rising edge. Specifically, the count value is reset to zero at the rising edge of the processing timing signal HIT and thereafter incremented by one at each SCLK timing. Then, the count value is reset to zero at the timing of the rising edge of the next processing timing signal HIT and a value immediately before the reset is held and output as a count result.

4.3.3. Boundary Fraction Operation Unit

Figure 6:
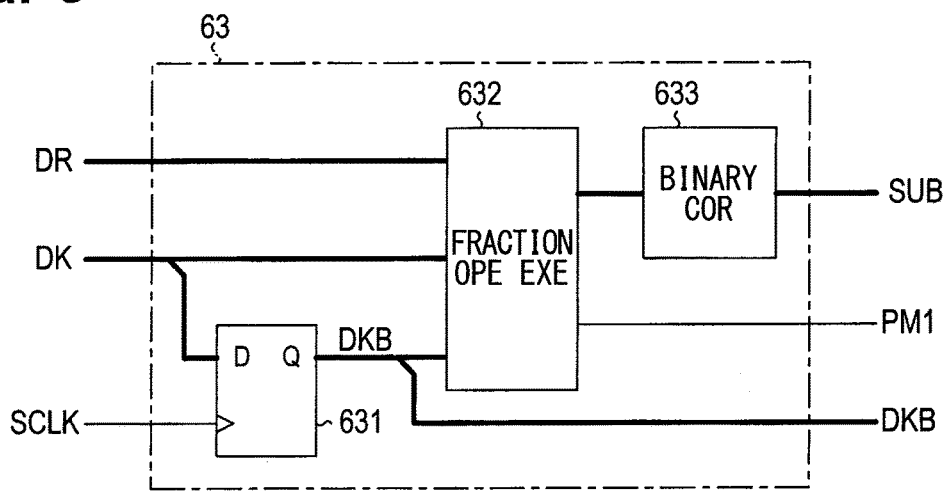
FIG. 6 is a block diagram illustrating the configuration of a boundary fraction operation unit.

As illustrated in FIG. 6, the boundary fraction operation unit 63 includes a latch circuit 631, a fraction operation execution unit 632, and a binary correction unit 633. The latch circuit 631 latches the second measurement output DK at the SCLK timing. The fraction operation execution unit 632 makes large-small relationship comparisons between the first measurement output DR, the second measurement output DK, and a one-clock earlier second measurement output DKB latched by the latch circuit 631, and generates a fraction operation value SUB and a first correction value PM1 from a result of the comparisons in accordance with a table illustrated in FIG. 7.

Figure 8A:
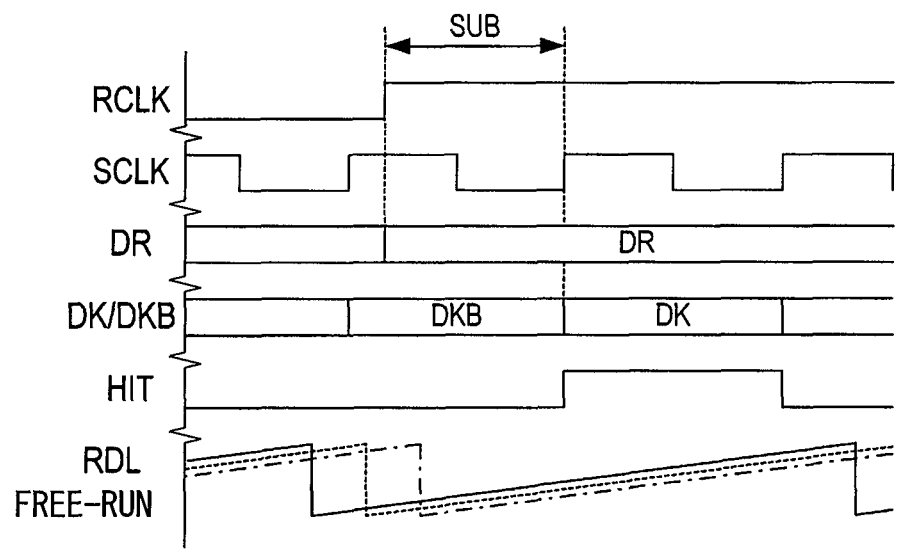
Figure 8B:
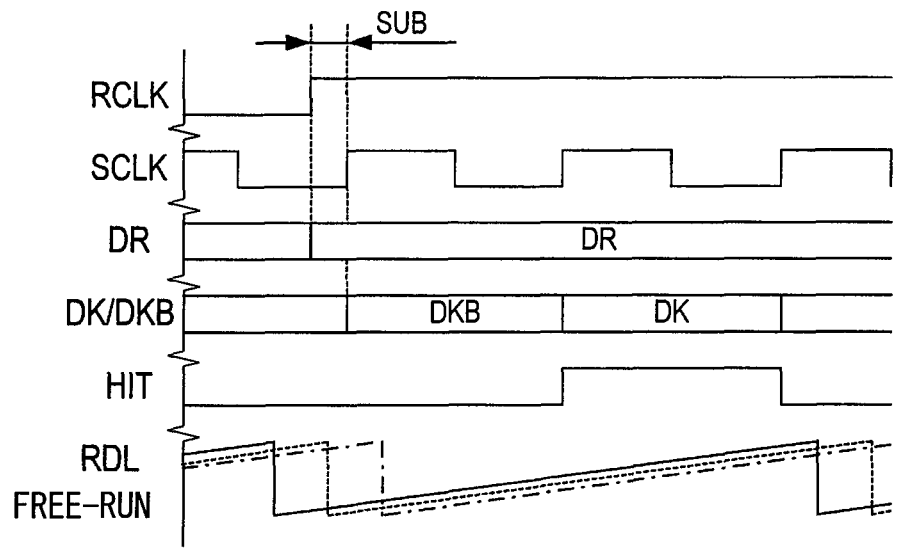

The fraction operation value SUB represents the number of stages of the inverter circuits passed by a pulse signal in the ring oscillator 2 between the RCLK timing and the SCLK timing immediately after the RCLK timing. In the normal detection state, SUB=DK−DR as illustrated in FIG. 8A. On the other hand, in the delayed detection state, SUB=DKB−DR as illustrated in FIG. 8B.

The first measurement output DR and the second measurement output DK are obtained by latching an RDL free-run (a value represented by the output P of the ring oscillator 2 and the output RCNT of the counter circuit 3) at the timings of the rising edges of the measurement target clock RCLK and the reference clock SCLK. As illustrated in FIGS. 8A and 8B, the RDL free-run repeats values from zero to the upper limit value and is synchronized with neither the clock RCLK nor the clock SCLK. Thus, the large-small relationship between DK, DR, and DKB does not necessarily satisfy DK DR, and DKB DR. However, when DK<DR and DKB<DR, the above subtraction processing is executed with the higher-order bit with respect to the most significant bit of DK, DKB defined as one so as to constantly maintain the fraction operation value SUB at a non-negative value.

Since the period of the RDL free-run is set at twice the period of the reference clock SCLK or more, the relationships between DK, DR, DKB and the RDL free-run are aggregated into three patterns each in both the normal detection state and the delayed detection state. That is, as illustrated in FIG. 8A, when DKB<DR<DK (indicated by a solid line), DR<DK<DKB (indicated by a dotted line), and DK<DKB<DR (indicated by a dot-dash line), a state can be determined to be the normal detection state. As illustrated in FIG. 8B, when DR<DKB<DK (indicated by a solid line), DKB<DK<DR (indicated by a dotted line), and DK<DR<DKB (indicated by a dot-dash line), a state can be determined to be the delayed detection state.

In the RCLK period count unit 65, count start/finish is performed in accordance with the processing timing signal HIT. Thus, in the delayed detection state, the count start/finish is delayed by one clock. In order to represent this, the first correction value PM1 is set at PM1=0 (correction of the count value is not required) in the normal detection state and set at PM1=1 (correction of the count value is required) in the delayed detection state.

The binary correction unit 633 corrects the fraction operation value SUB obtained by the fraction operation execution unit 632 to a value represented by a binary number. That is, a value SUB_U which is a value of higher-order 9 bits of the first measurement output DR and the second measurement output DK (in turn, the fraction operation value SUB) based on the output of the counter circuit 3 is a value that is counted up by one every time a value represented by lower-order 4 bits reaches 30. Thus, a result obtained by subtracting a value that is twice the value represented by the higher-order 9 bits from the fraction operation value SUB is output as a corrected fraction operation value SUB (SUB−SUB_U×2).

4.3.4. SCLK Period Operation Unit

Referring back to FIG. 3, the SCLK period operation unit 62 performs subtraction processing on the basis of the second measurement output DK and the one-clock earlier second measurement output DKB supplied from the boundary fraction operation unit 63 to obtain an SCLK period operation value SCW (=DK−DKB) which represents the period of the reference clock SCLK. However, the SCLK period operation value SCW is not a correct binary number similarly to the fraction operation value SUB obtained in the fraction operation execution unit 632. Thus, the processing similar to that performed by the binary correction unit 633 is executed, and a corrected SCLK period operation value SCW is output.

4.3.5. Fraction Correction Value Operation Unit

Figures 9, 10:
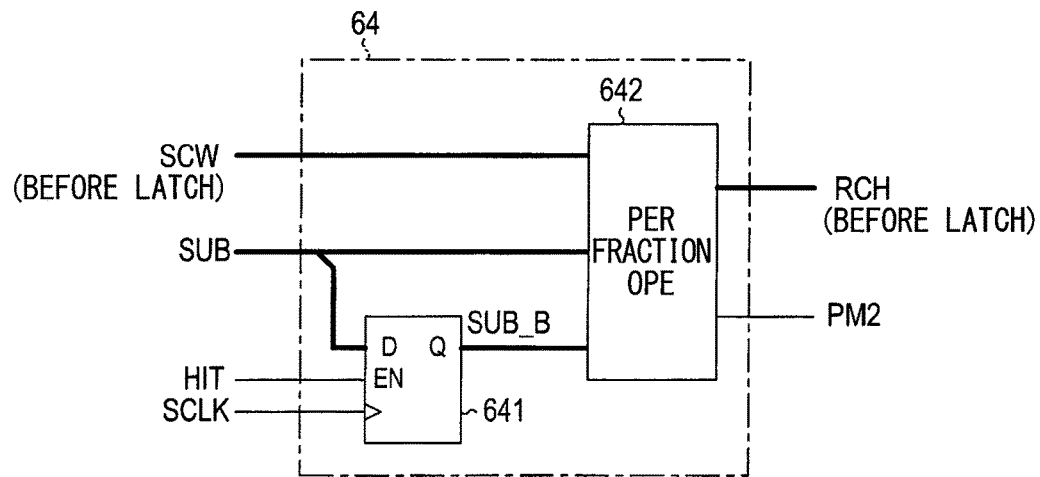
FIG. 9 is a block diagram illustrating the configuration of a fraction correction value operation unit.
FIG. 10 is a table illustrating processing contents in a period fraction value operation unit.

As illustrated in FIG. 9, the fraction correction value operation unit 64 includes a latch circuit 641 and a period fraction operation unit 642. The latch circuit 641 latches the fraction operation value SUB at the SCLK timing when the processing timing signal HIT is at a high level. In practice, the fraction operation value SUB is latched at the SCLK timing when the processing timing signal HIT changes from a high level to a low level. The period fraction operation unit 642 makes a large-small relationship comparison between a fraction operation value (following fraction) SUB and a fraction operation value (preceding fraction) SUB_B latched by the latch circuit 641 in the preceding target period, and generates an RCLK period fraction operation value RCH and a second correction value PM2 from a result of the comparison in accordance with a table illustrated in FIG. 10.

Figure 11A:
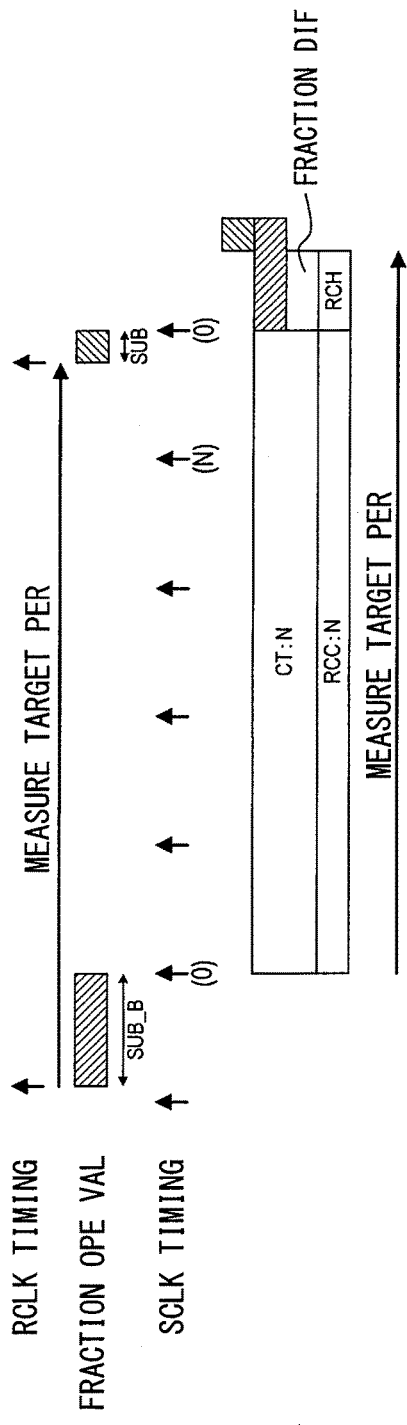
Figure 11B:
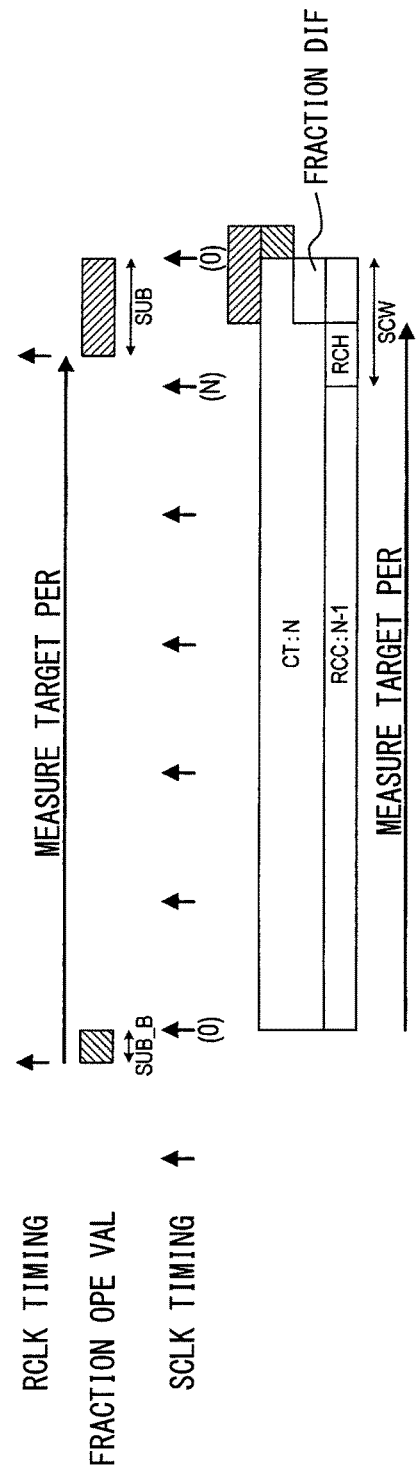

The RCLK period fraction operation value RCH is a value that represents a remaining time less than the period of the reference clock SCLK (hereinbelow, referred to as "SCLK period"), the remaining time being obtained by subtracting a time that is an integer multiple of the SCLK period from one period of the measurement target clock RCLK (measurement target period) and represents the number of stages of the inverter circuits passed by a pulse signal in the ring oscillator 2 during the remaining time. As illustrated in FIGS. 11A and 11B, the preceding fraction SUB_B is a fraction that is detected at a start timing of the measurement target period, and the following fraction SUB is a fraction that is detected at a finish timing of the measurement target period.

When SUB_B≥SUB, the RCLK period fraction operation value RCH can be obtained by SUB_B−SUB (refer to FIG. 11A). On the other hand, when SUB_B<SUB, the RCLK period fraction operation value RCH can be obtained by SCW−(SUB−SUB_B) using the SCLK period operation value SCW (refer to FIG. 11B).

When SUB_B≥SUB, the number of periods of the reference clock SCLK included in the measurement target period is equal to a count value in the RCLK period count unit 65 (refer to FIG. 11A). On the other hand, when SUB_B<SUB, the number of periods of the reference clock SCLK included in the measurement target period is equal to a value obtained by decrementing the count value in the RCLK period count unit 65 (refer to FIG. 11B) by one. In order to represent this, the second correction value PM2 is set at PM2=0 (correction of the count value is not required) when SUB_B≥SUB and set at PM2=1 (correction of the count value is required) when SUB_B<SUB.

4.3.6. Count Value Correction Unit

Figures 12, 13:
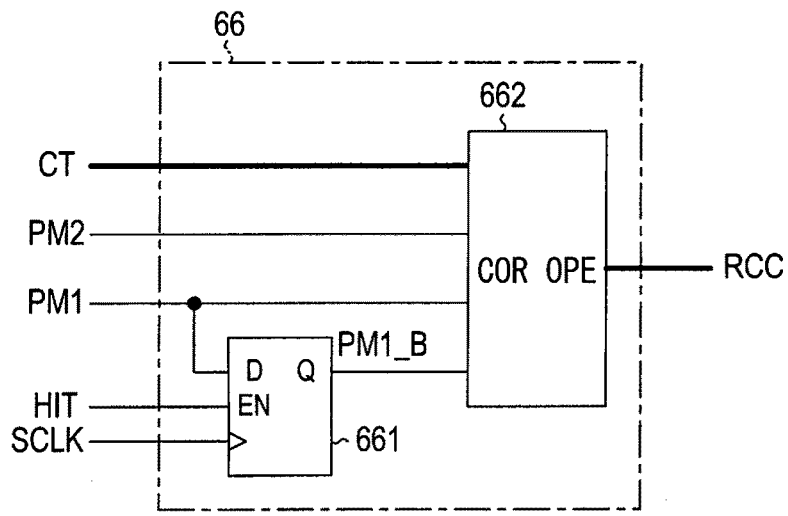
FIG. 12 is a block diagram illustrating the configuration of a count value correction unit.
FIG. 13 is a table illustrating processing contents in a correction operation unit.

As illustrated in FIG. 12, the count value correction unit 66 includes a latch circuit 661 and a correction operation unit 662. The latch circuit 661 latches the first correction value PM1 at the SCLK timing when the processing timing signal HIT is at a high level. In practice, the first correction value PM1 is latched at the SCLK timing when the processing timing signal HIT changes from a high level to a low level. The correction operation unit 662 corrects a count value CT obtained by the RCLK period count unit 65 in accordance with a table illustrated in FIG. 13 on the basis of the first correction value PM1, a first correction value PM1_B latched by the latch circuit 661 at the preceding processing timing, and the second correction value PM2 to generate an RCLK period count value RCC.

Figure 14A:
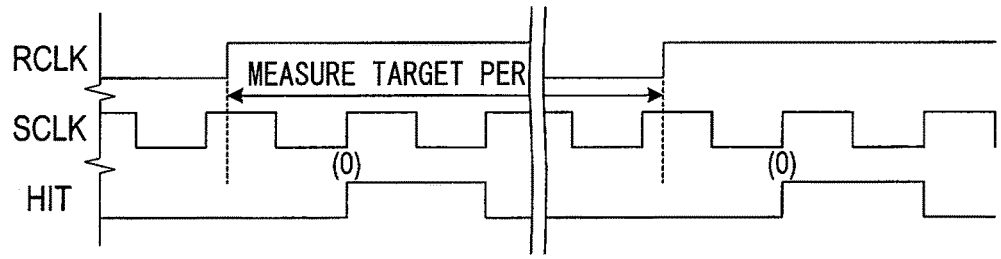
Figure 14B:
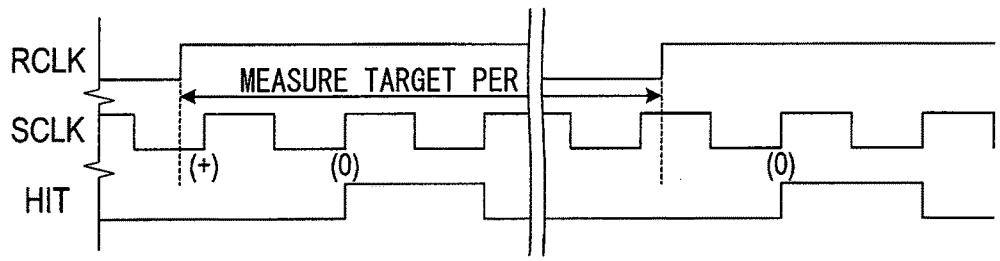
Figure 14C:
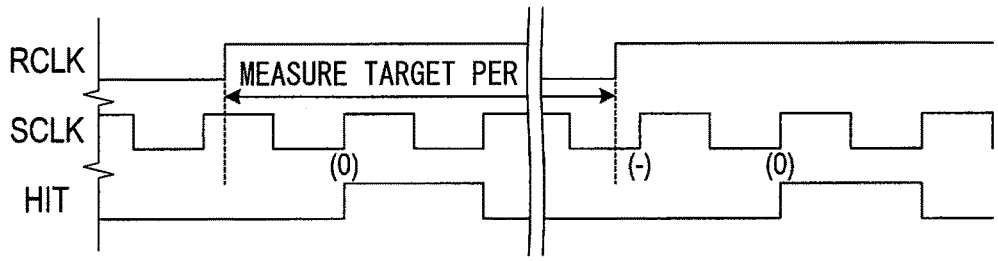
Figure 14D:
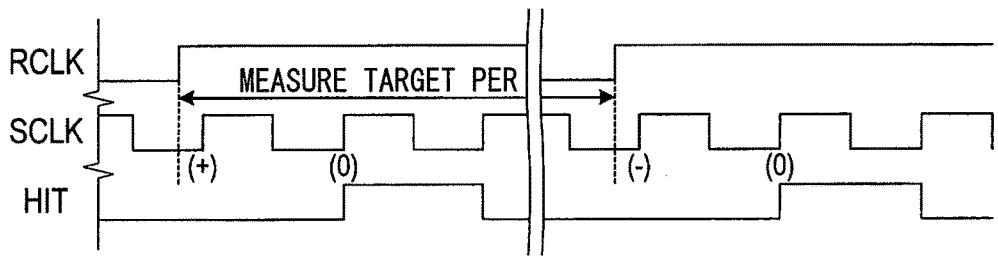

The first correction value PM1 represents whether a detection state of the processing timing signal HIT at the RCLK timing is the normal detection state (PM1=0) or the delayed detection state (PM1=1). There are four patterns of correction by a combination of the first correction value PM1_B at the start timing of the measurement target period and the first correction value PM1 at the finish timing of the measurement target period. That is, when the detection state is the normal detection state at both the start timing and the finish timing (PM1_B=0, PM1=0), as illustrated in FIG. 14A, count of the count value CT is started at the SCLK timing immediately after the start timing and finished at the SCLK timing immediately before the finish timing. In this case, correction of the count value CT is not required. When the detection state is the delayed detection state at the start timing and the normal detection state at the finish timing (PM1_B=1, PM1=0), as illustrated in FIG. 14B, count of the count value CT is started at the second SCLK timing after the start timing and finished at the SCLK timing immediately before the finish timing. In this case, it is necessary to increment the count value CT by one to correct the count value by an uncounted one immediately after the start timing. When the detection state is the normal detection state at the start timing and the delayed detection state at the finish timing (PM1_B=0, PM1=1), as illustrated in FIG. 14C, count of the count value CT is started at the SCLK timing immediately after the start timing and finished at the SCLK timing immediately after the finish timing. In this case, it is necessary to decrement the count value CT by one to correct the count value by an unnecessarily counted one immediately after the finish timing. When the detection state is the delayed detection state at both the start timing and the finish timing (PM1_B=1, PM1=1), as illustrated in FIG. 14D, count of the count value CT is started at the second SCLK timing after the start timing and finished at the SCLK timing immediately after the finish timing. In this case, it is necessary to correct the count value by an uncounted one immediately after the start timing and an unnecessarily counted one immediately after the finish timing. However, since the increment by one in the former correction and the decrement by one in the latter correction are offset, it is not necessary to correct the count value CT after all.

As described above in the description for the fraction correction value operation unit 64, in the second correction value PM2, it is not necessary to correct the count value CT when PM=2, and it is necessary to decrement the count value CT by one when PM2=1. That is, the correction operation unit 662 executes eight patterns of correction in total by combining four patterns of correction using the first correction values PM1, PM_B and two patterns of correction using the second correction value PM2 (refer to FIG. 13).

4.3.7. Output Unit

Referring back to FIG. 3, the output unit 67 includes latch circuits 671, 672, 673.

Each of the latch circuits 671 to 673 latches the corresponding input value at the SCLK timing when the processing timing signal HIT is at a high level. The latch circuit 671 uses the SCLK period operation value SCW generated by the SCLK period operation unit 62 as an input value. The latch circuit 672 uses the RCLK period fraction operation value RCH generated by the fraction correction value operation unit 64 as an input value. The latch circuit 673 uses the RCLK period count value RCC generated by the count correction unit 66 as an input value.

4.3.8. Operation of Fraction Processing Unit

Figure 15:
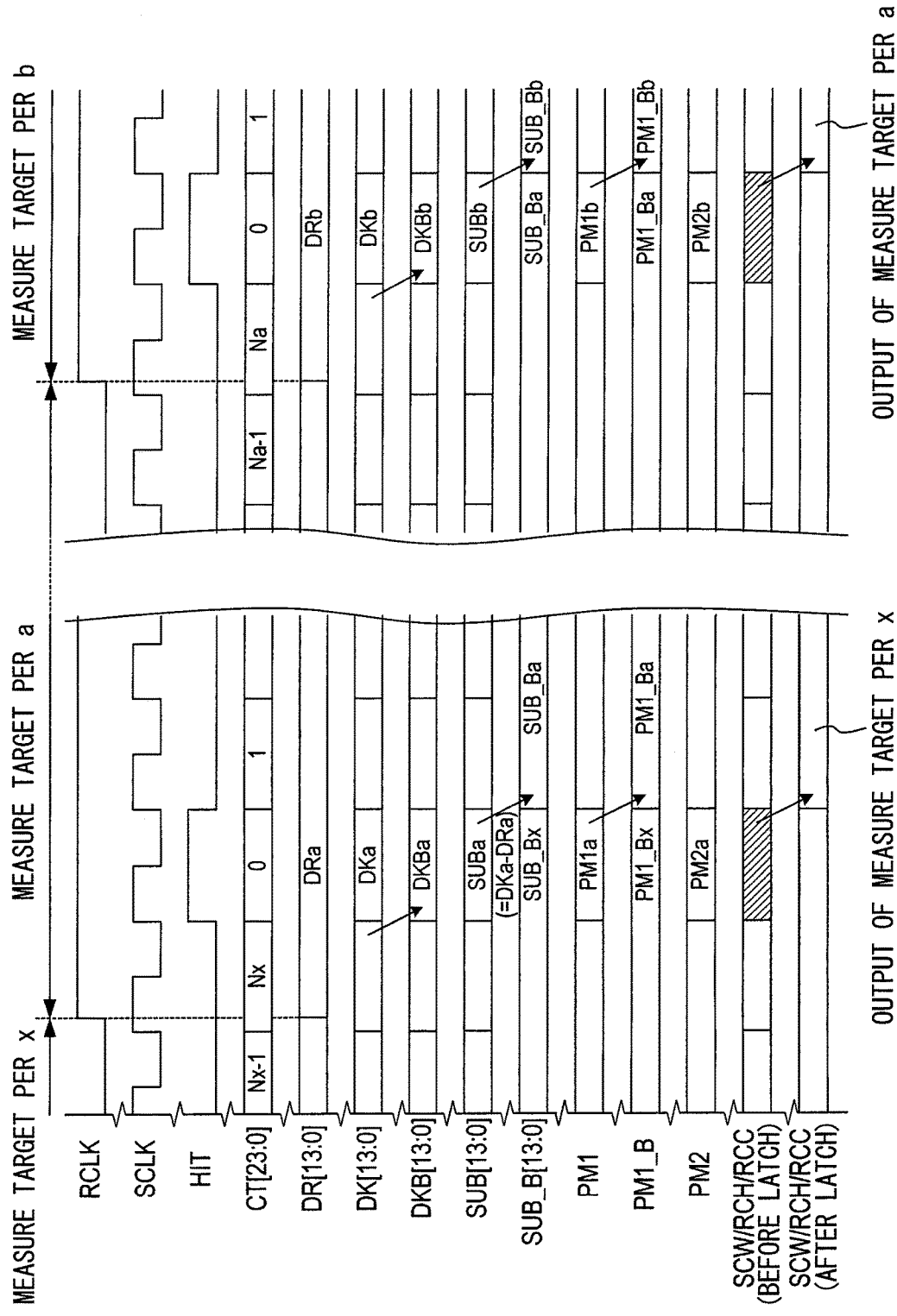
FIG. 15 is a timing chart illustrating the entire operation of the fraction processing unit.

As illustrated in FIG. 15, the fraction processing unit 6 configured in this manner generates the count value CT on the basis of the processing timing signal HIT generated from the RCLK timing and the SCLK timing. Further, during the processing target period when the processing timing signal HIT becomes a high level, each unit of the fraction processing unit 6 executes an operation to generate the RCLK period fraction operation value RCH from the first measurement output DR and the second measurement output DK, the RCLK period count value RCC by correcting the count value CT, and the SCLK period operation value SCW from the second measurement output DK. Further, each of the operation results RCH, RCC, SCW is latched and output at the SCLK timing when the processing target period is finished. The SCLK period operation value SCW is used, for example, when the RCLK period fraction operation value RCH is converted into a value based on the period of the reference clock SCLK (one, for example).

5. DCO Block

Referring back to FIG. 1, the DCO block 20 includes an output timing generation unit 7 and an output processing unit 8 and constitutes the digital control oscillator circuit 1b together with the ring oscillator 2 and the counter circuit 3 described above.

In accordance with an output instruction signal PT, a period setting value CD [23:0], the output P [14:0] of the ring oscillator 2, the output RCNT [8:0] of the counter circuit 3, the SCLK period operation value SCW [13:0] supplied from the W-TDC block 10, and the second measurement output DK [13:0], the DCO block 20 generates DCO outputs POUT, POUT2 having a period corresponding to the period setting value CD [23:0] while the output instruction signal PT is maintained at a high level.

The period setting value CD [23:0] is a 24-bit value representing the period of the DCO output POUT as the magnification ratio with respect to the period of the reference clock SCLK. In the period setting value, the higher-order 14-bit CD [23:10] is referred to as an integer part, and the lower-order 10-bit CD [9:0] is referred to as a decimal point part. In the integer part, a value of an integer part in a result obtained by dividing a desired period by the period of the reference clock SCLK is set. In the decimal point part, a value after the decimal point in the above dividing result, that is, a value representing the size of a part less than one period of the reference clock SCLK in the unit of $1/2^{10}$ of the period of the reference clock SCLK is set.

5.1. Output Timing Generation Unit

Figure 16:
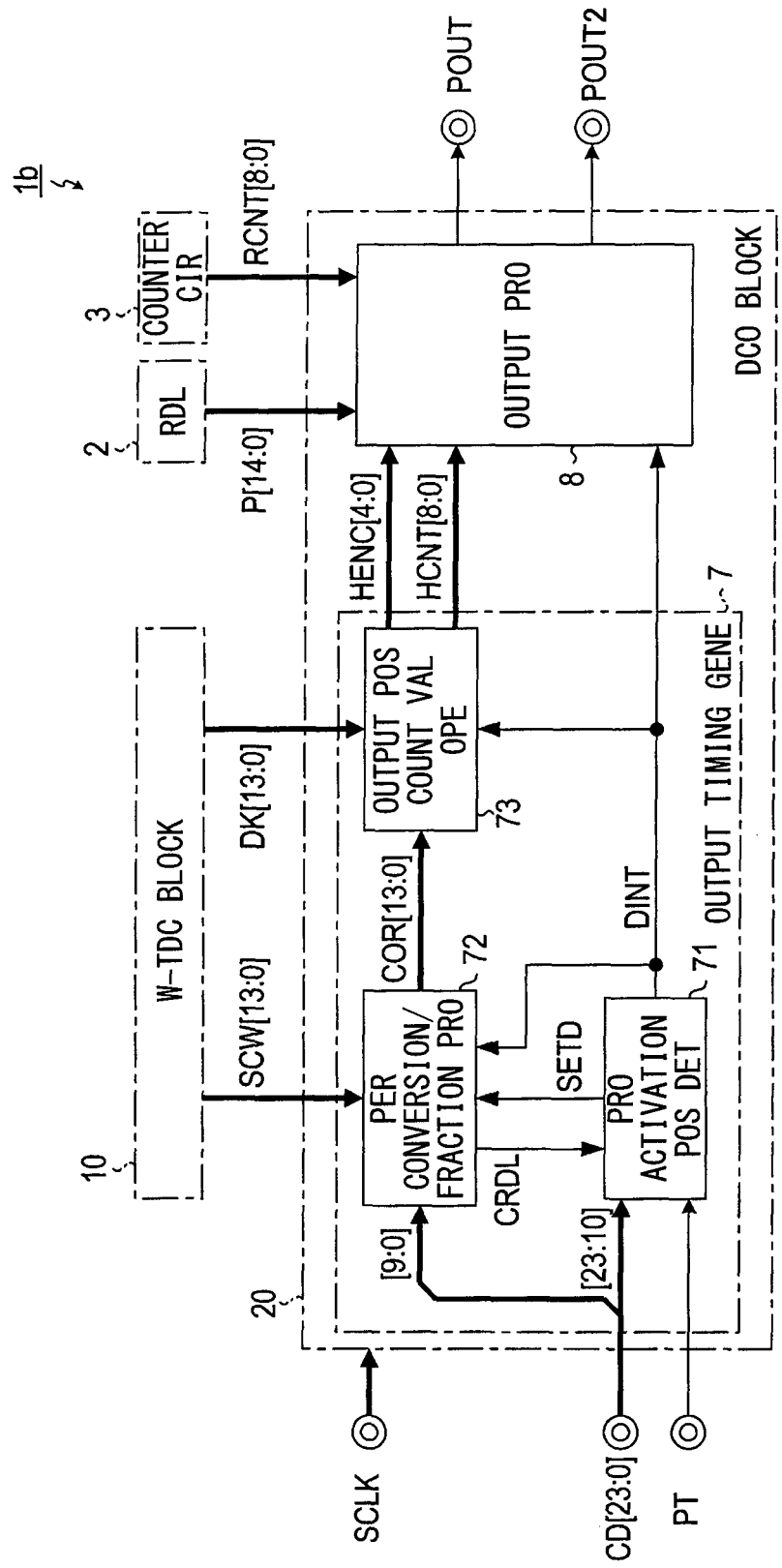
FIG. 16 is a block diagram illustrating the configuration of a digital control oscillator circuit (DCO)

As illustrated in FIG. 16, the output timing generation unit 7 includes a processing activation position detection unit 71, a period conversion/fraction processing unit 72, and an output position count value operation unit 73.

5.1.1. Activation Timing Detection Unit

Figure 17:
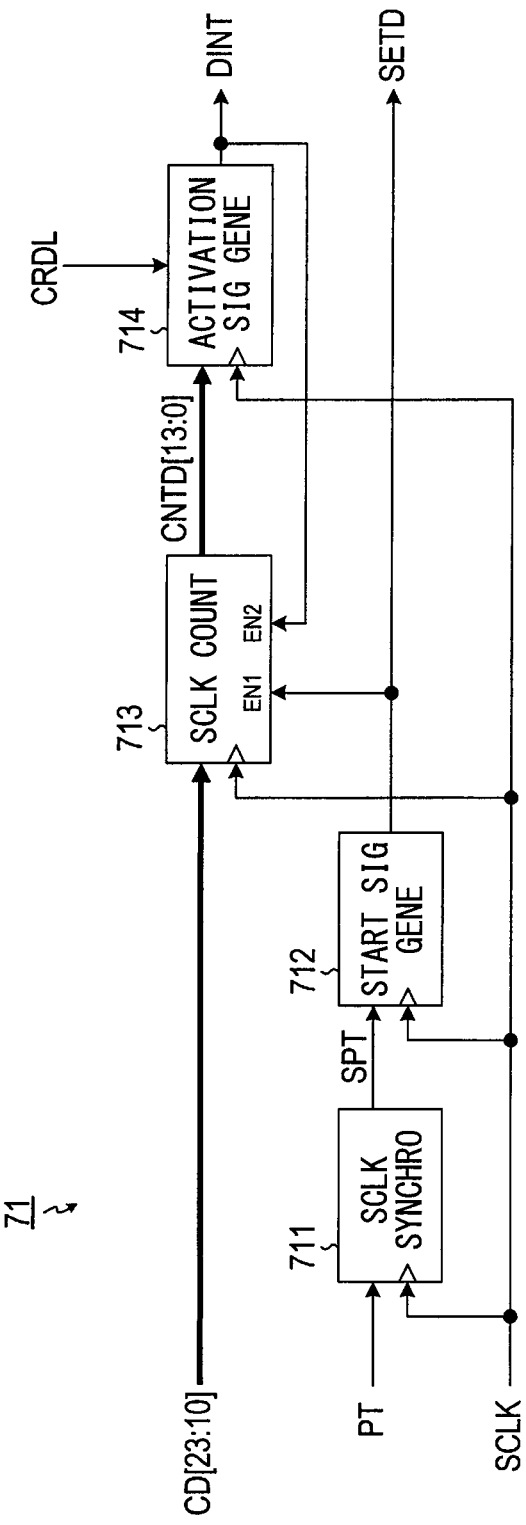
FIG. 17 is a block diagram illustrating the configuration of a processing activation position detection unit.
Figure 18:
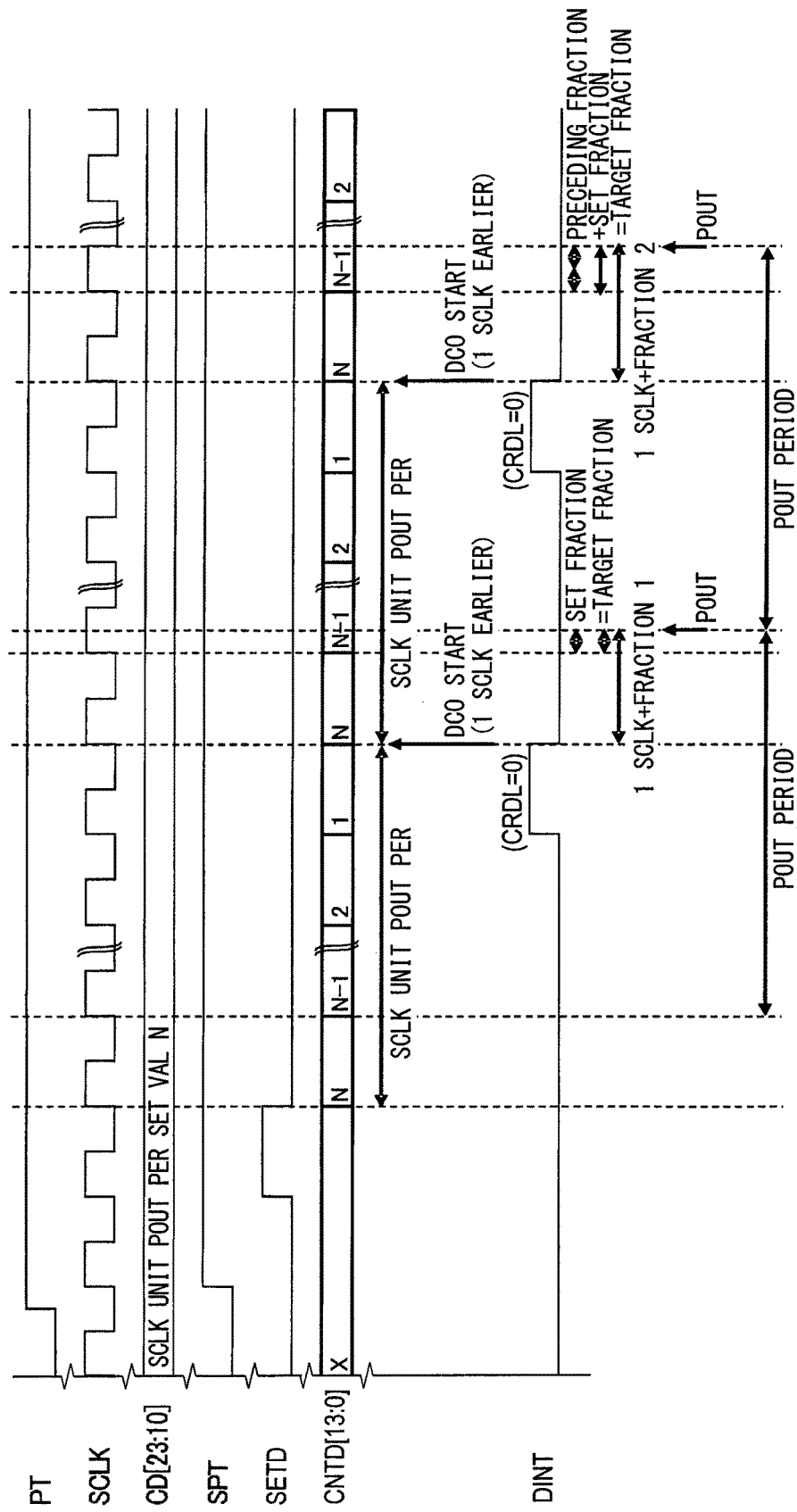
FIG. 18 is a timing chart illustrating the operation of the processing activation position detection unit.
Figure 19:
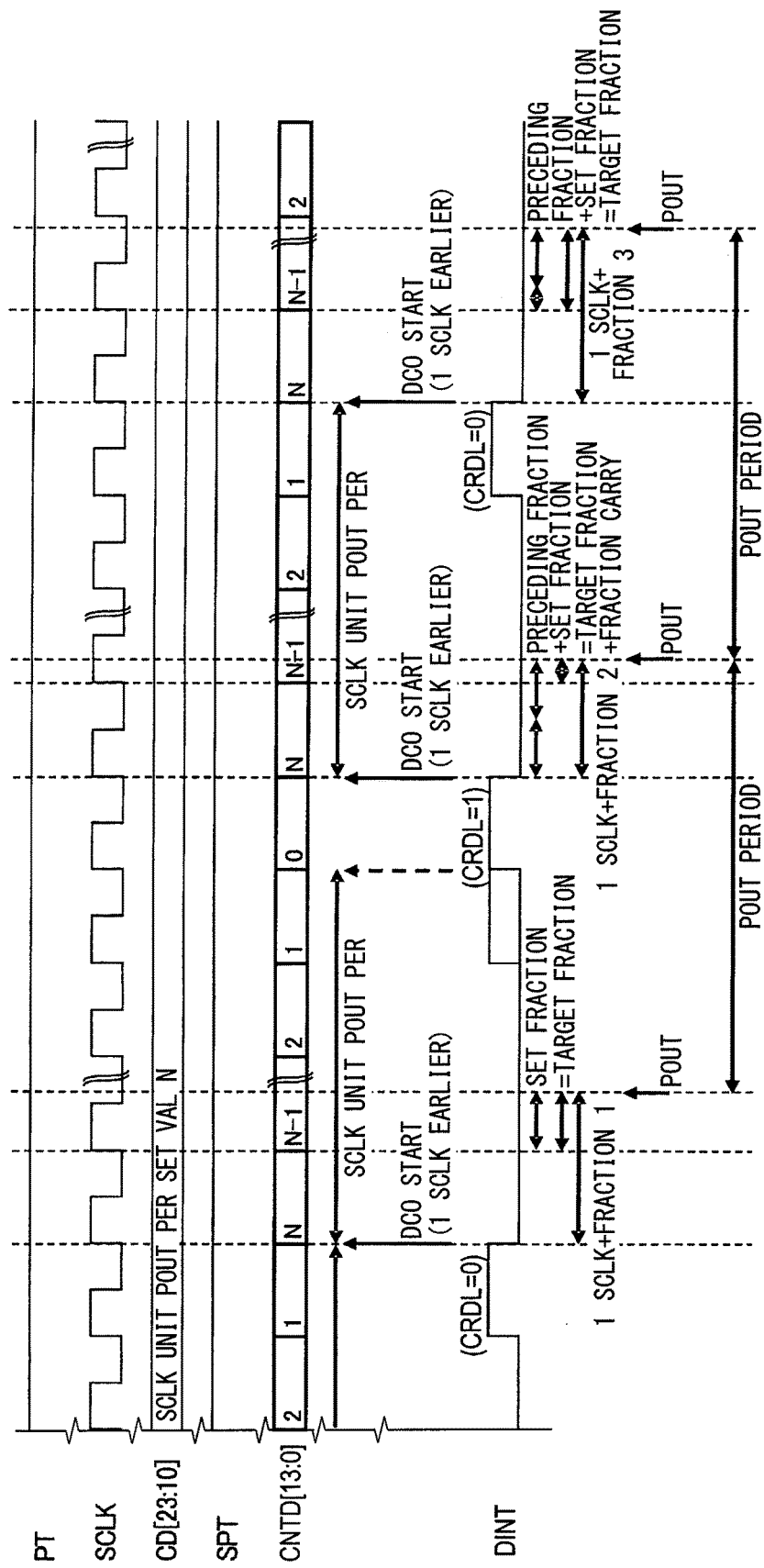
FIG. 19 is a timing chart illustrating the operation of the processing activation position detection unit.

The processing activation position detection unit 71 will be described with reference to FIGS. 17, 18, and 19. The processing activation position detection unit 71 includes an SCLK synchronization unit 711, a start signal generation unit 712, an SCLK count unit 713, and an activation signal generation unit 714.

The SCLK synchronization unit 711 latches the output instruction signal PT at the SCLK timing which is the timing of the rising edge of the reference clock SCLK to generate an output instruction synchronization signal SPT which is synchronized with the reference clock SCLK.

The start signal generation unit 712 generates a start position signal SETD which rises at a timing delayed by one clock in the reference clock SCLK from a rising edge of the output instruction synchronization signal SPT and then falls after being maintained at a high level by a clock of the reference clock SCLK.

The SCLK count unit 713 presets a value N of the integer part CD [23:10] of the period setting value as a count value CNTD [13:0] at the falling timing of the start position signal SETD, and then down-counts the count value CNTD [13:0] at the SCLK timing. Thereafter, the SCLK count unit 713 presets the count value CNTD [13:0] at each falling timing of an activation position signal DINT output by the activation signal generation unit 714 and repeats the same processing.

The activation signal generation unit 714 generates the activation position signal DINT in accordance with a fraction value carry signal CRDL from the period conversion/fraction processing unit 72 and the count value CNTD [13:0] of the SCLK count unit 713. Specifically, when CRDL=0, that is, no carry occurs, the activation position signal DINT is brought into a high level at a timing when the count value CNTD [13:0] becomes one (refer to FIG. 18). When CRDL=1, that is, a carry occurs, the activation position signal DINT is brought into a high level at a timing when the count value CNTD [13:0] becomes zero (refer to FIG. 19). The fraction value carry signal CRDL becomes "1" every time a fraction addition value DCOA [9:0] reaches a value corresponding to one period of the SCLK, that is, every time DCOA [10]=1 is satisfied.

5.1.2 Period Conversion/Fraction Processing Unit

Figure 20:
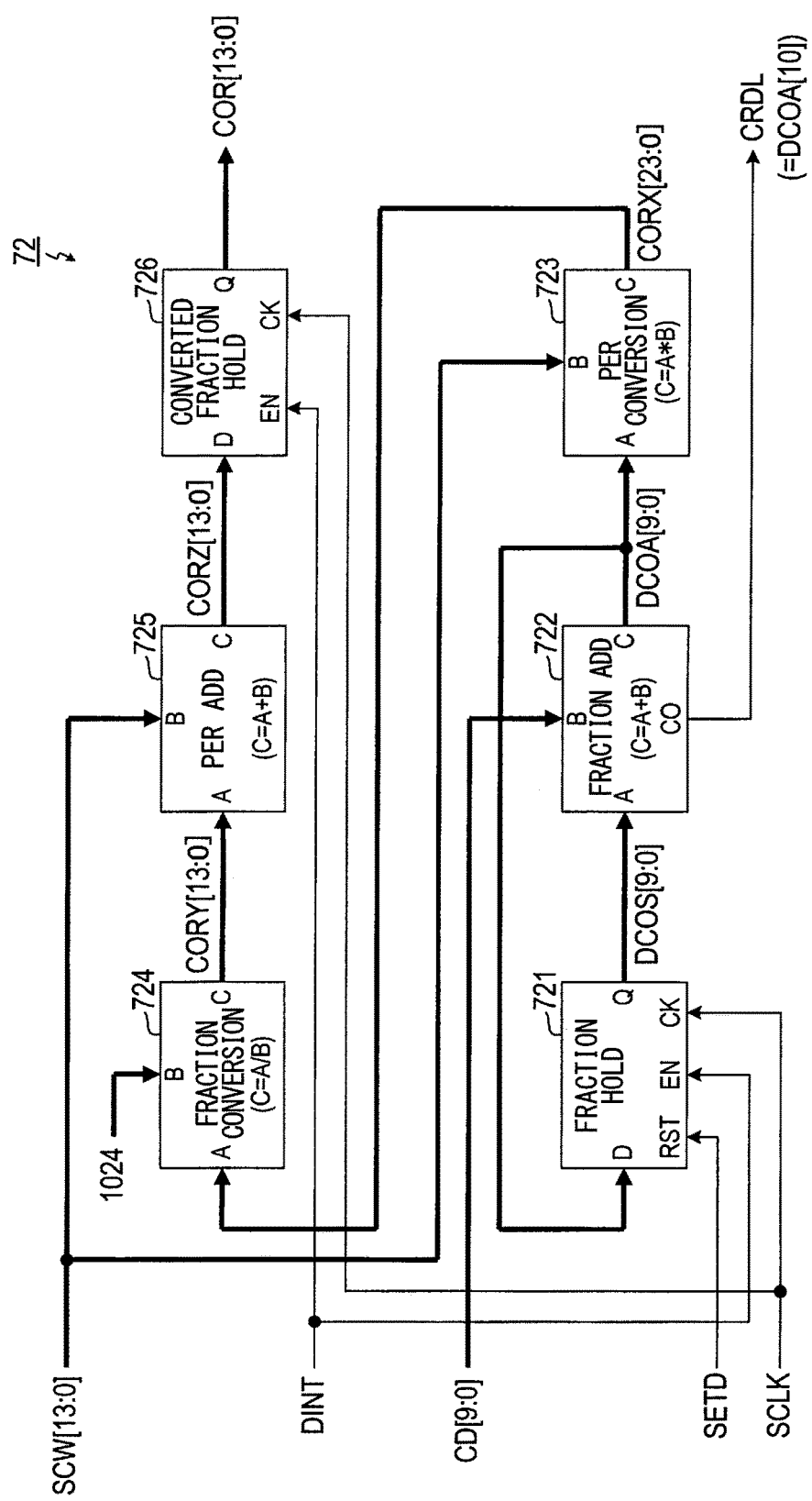
FIG. 20 is a block diagram illustrating the configuration of a period conversion/fraction processing unit.

Next, the period conversion/fraction processing unit 72 will be described with reference to FIGS. 20 and 21. The period conversion/fraction processing unit 72 includes a fraction holding unit 721, a fraction addition unit 722, a period conversion unit 723, a fraction conversion unit 724, a period addition unit 725, and a converted fraction holding unit 726.

The fraction holding unit 721 holds the fraction addition value DCOA [9:0] output by the fraction addition unit 722 at the SCLK timing when the activation position signal DINT output by the activation signal generation unit 714 of the processing activation position detection unit 71 is at a high level, that is, the falling timing of the DINT. A fraction holding value DCOS [9:0] held by the fraction holding unit 721 is reset to zero when the start position signal SETD output from the start signal generation unit 712 of the processing activation position detection unit 71 is at a high level, that is, by the input of the output instruction signal PT.

The fraction addition unit 722 adds a decimal point part CD [9:0] of the period setting value and the fraction holding value DCOS [9:0] held by the fraction holding unit 721. In the addition result DCOA [10:0], the lower-order 10 bits are output as the fraction addition value DCOA [9:0], and the remaining most significant bit DCOA [10] is output as the fraction value carry signal CRDL.

The period conversion unit 723 outputs a result obtained by multiplying the fraction addition value DCOA [9:0] output by the fraction addition unit 722 by the SCLK period operation value SCW [13:0] as a converted value CORX [23:0].

The fraction conversion unit 724 outputs a result obtained by dividing the converted value CORX [23:0] output by the period conversion unit 723 by a predetermined value 1024 ($=2^{10}$) , that is, a result obtained by removing the lower-order 10 bits as a fraction converted value CORY [13:0].

The period addition unit 725 outputs a fraction operation value CORZ [13:0] obtained by adding the SCLK period operation value SCW [13:0] to the fraction converted value CORY [13:0] output by the fraction conversion unit 724.

The converted fraction holding unit 726 latches the fraction operation value CORZ [13:0] output by the period addition unit 725 at the SCLK timing when the activation position signal DINT is at a high level, that is, the falling timing of the DINT and outputs the latched value as a converted fraction holding value COR [13:0].

That is, the period conversion/fraction processing unit 72 adds up a value of the decimal point part CD [9:0] at each timing of the activation position signal DINT to obtain the fraction addition value DCOA [9:0] and converts the fraction addition value DCOA into the number of passed stages of the delay elements in the ring oscillator 2 using the SCLK period operation value SCW [13:0] to obtain the converted fraction holding value COR [13:0].

Figure 21:
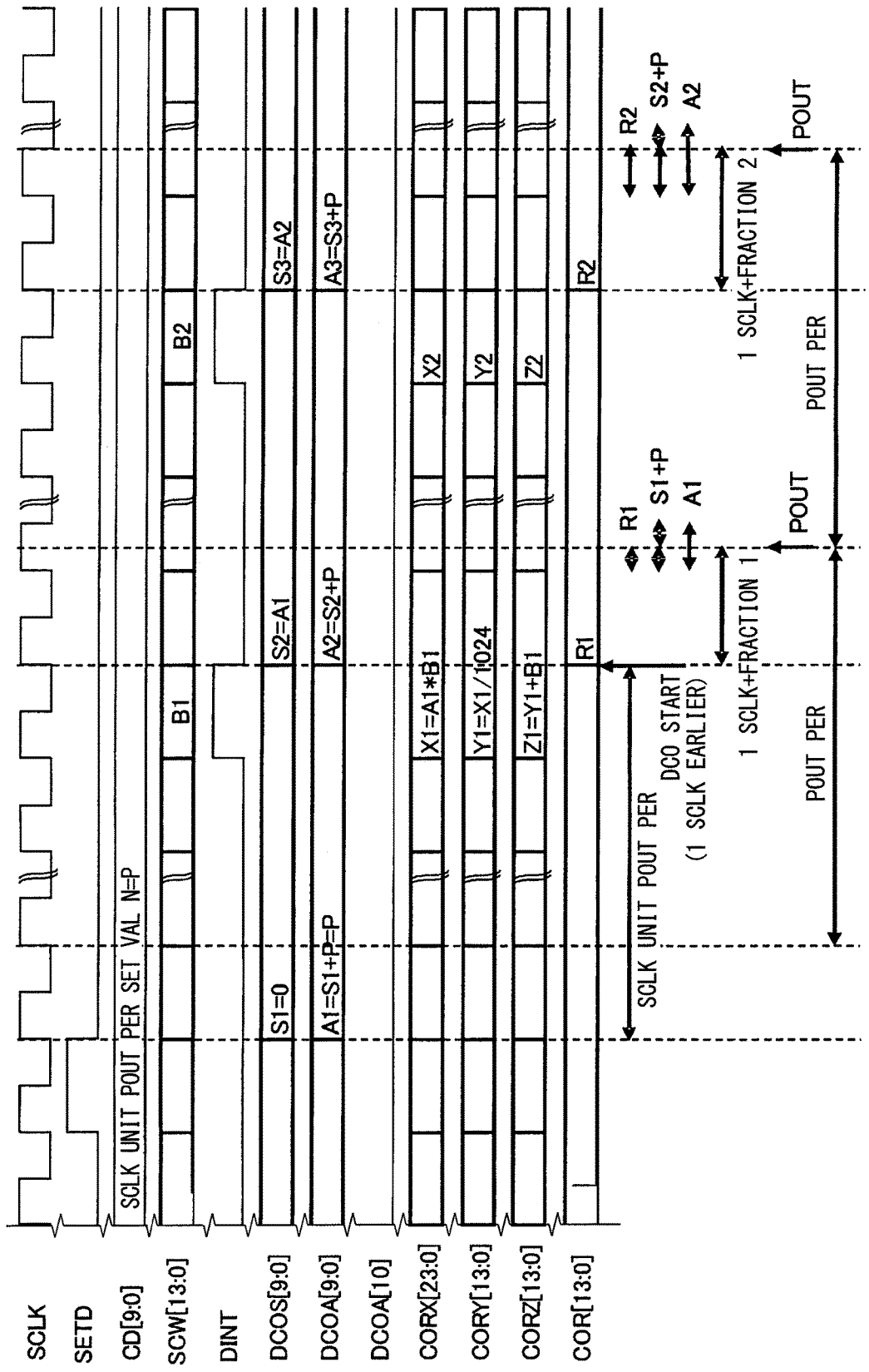
FIG. 21 is a timing chart illustrating the operation of the period conversion/fraction processing unit.

Specifically, as illustrated in FIG. 21, when P denotes a value of the decimal point part CD [9:0], Bi denotes a value of the SCLK period operation value SCW [13:0] at the timing of the i-th activation position signal DINT (hereinbelow, merely referred to as "the i-th timing"), Ai denotes a value of the fraction addition value DCOA [9:0] at the i-th timing, and Ri denotes a value of the converted fraction holding value COR [13:0] at the i-th timing, Ri can be obtained by Equation (1). Ai can be obtained by Equation (2), and an initial value of Ai is A0=0.

$$Ri=Bi+Ai \times Bi/1024 \qquad (1)$$

$$Ai=Ai-1+P \qquad (2)$$

The division in Equation (1) (that is, the division in the fraction conversion unit 724) is performed because a value "1" of the decimal point part CD [9:0] is represented in the unit of 1/1024 of a value "1" in the integer part. Further, the addition of Bi in Equation (1) (that is, the addition of SCW [13:0] in the period addition unit 725) is performed for ensuring a processing time. Although a value of one clock is added in the present embodiment, a value of two clocks or more may be added.

5.1.3. Output Position Count Value Operation Unit

Figure 22:
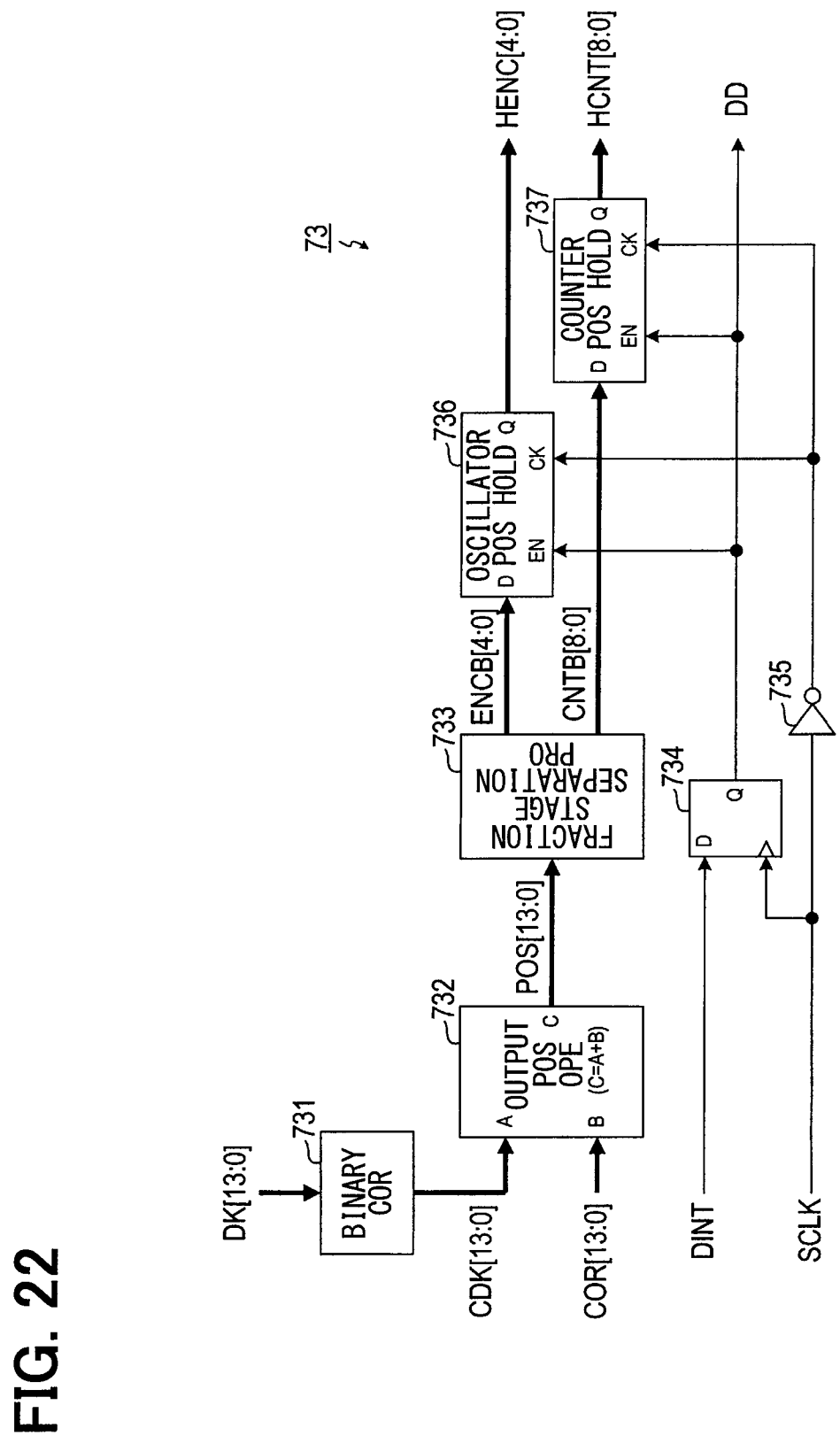
FIG. 22 is a block diagram illustrating the configuration of an output position count value operation unit.

As illustrated in FIG. 22, the output position count value operation unit 73 includes a binary correction unit 731, an output position operation unit 732, a fraction stage separation processing unit 733, a latch circuit 734, an inverter circuit 735, an oscillator position holding unit 736, and a counter position holding unit 737.

The binary correction unit 731 outputs a result obtained by converting the second measurement output DK [13:0] into a binary number as an RDL free-run position CDK [13:0]. Since the binary correction unit 731 is similar to the binary correction unit 633 described above, description thereof will be omitted. The processing of conversion into a binary number is also referred to as odd-number stage correction processing.

The output position operation unit 732 outputs a result obtained by adding the converted fraction holding value COR [13:0] output by the period conversion/fraction processing unit 72 to the RDL free-run position CDK [13:0] as an output absolute position POS [13:0].

The fraction stage separation processing unit 733 outputs an integer part of an operation result obtained by multiplying the output absolute position POS [13:0] by 32/30 as a counter position CNTB [8:0] and outputs the remainder thereof as an oscillator position ENCB [4:0]. That is, a reverse odd-number stage correction processing which is a reverse processing of the odd-number stage correction processing is performed on the POS [13:0] represented by a binary number to convert the output absolute position POS [13:0] into the counter position CNTB [8:0] which represents a count value in the counter circuit 3 and the oscillator position ENCB [4:0] which represents a pulse position in the ring oscillator 2.

The latch circuit 734 outputs a result obtained by latching the activation position signal DINT output by the processing activation position detection unit 71 at the SCLK timing as a delayed activation position signal DD. The delayed activation position signal DD is delayed by one period of the reference clock SCLK from the activation position signal DINT.

The inverter circuit 735 outputs an inverted reference clock RSCLK obtained by inverting the reference clock SCLK.

The oscillator position holding unit 736 and the counter position holding unit 737 respectively hold the oscillator position ENCB [4:0] and the counter position CNTB [8:0] output by the fraction stage separation processing unit 733 and output the held values as a held oscillator position HENC [4:0] and a held counter position HCNT [8:0] at the timing of a rising edge of the inverted reference clock RSCLK (hereinbelow, also referred to as "inverted SCLK timing") when the delayed activation position signal DD is at a high level.

5.2. Output Processing Unit

Figure 23:
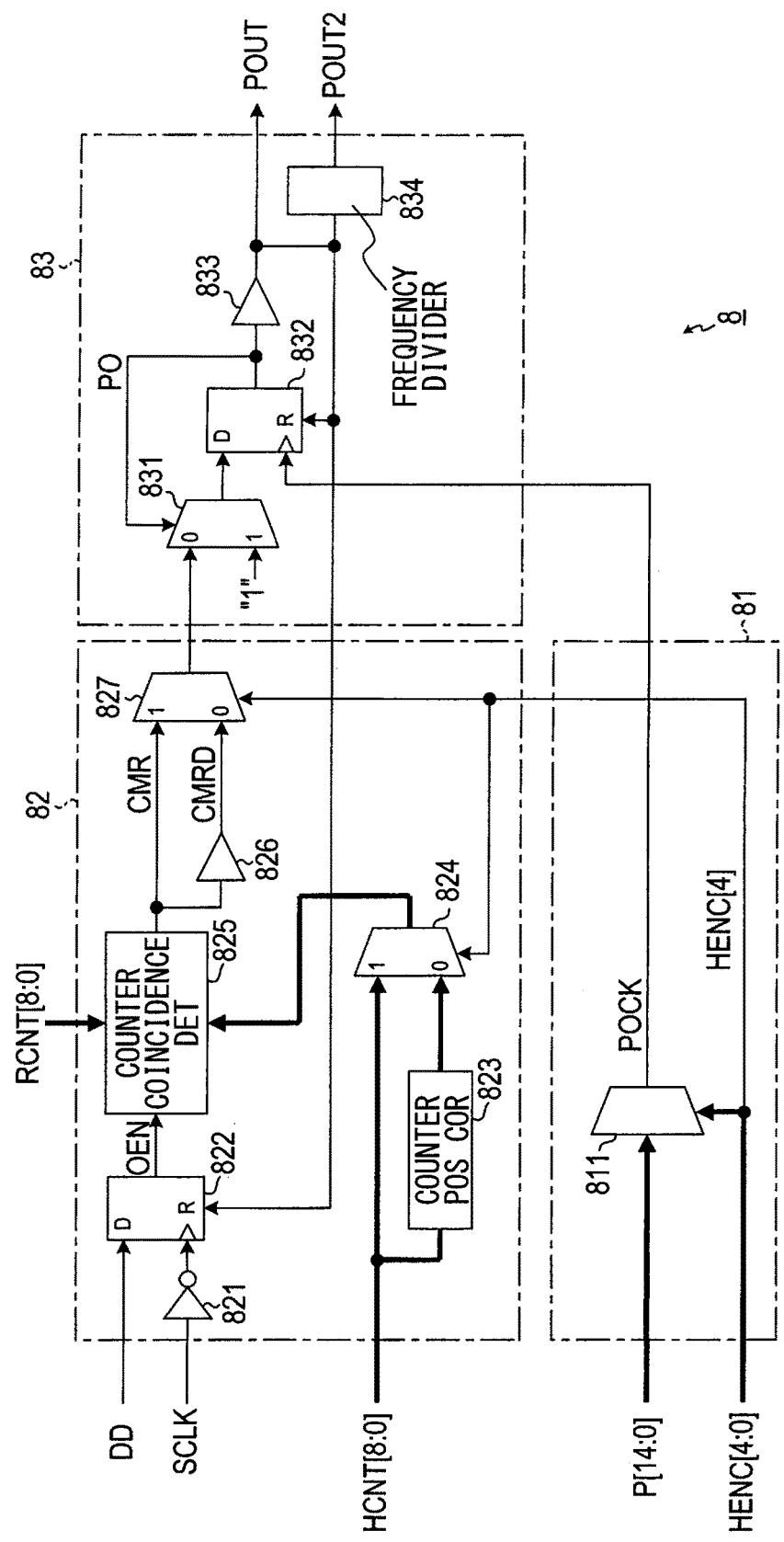
FIG. 23 is a block diagram illustrating the configuration .of an output processing unit.

As illustrated in FIG. 23, the output processing unit 8 includes an oscillator position selection unit 81, a counter position selection unit 82, and a signal generation unit 83.

The oscillator position selection unit 81 includes a selector 811. The selector 811 generates an output clock POCK which is synchronized with one timing selected from thirty timings represented by the rising edge and the falling edge of each bit P [i] (i=0 to 14) of the output P [14:0] of the ring oscillator 2 in accordance with the held oscillator position HENC [4:0] and has the selected timing as a rising edge. The oscillator position selection unit 81 outputs the most significant bit HENC [4] of the held oscillator position as a switching signal.

The counter position selection unit 82 includes an inverter circuit 821, a latch circuit 822, a counter position correction unit 823, a selector 824, a counter coincidence detection unit 825, a delay circuit 826, and a selector 827. The inverter circuit 821 inverts the reference clock SCLK to generate an inverted reference clock. The latch circuit 822 latches the delayed activation position signal DD at the rising edge of the inverted reference clock, that is, a falling edge of the reference clock SCLK and outputs the latched delayed activation position signal DD as an enabling signal OEN. The latch circuit 822 is reset by a high level of the DCO output POUT. The counter position correction unit 823 decrements a value represented by the held counter position HCNT [8:0] (hereinbelow, merely referred to as "HCNT") by one and outputs the decremented value. In accordance with a selection signal HENC [4], the selector 824 selects and outputs the held counter position HCNT when HENC [4]=1, and selects and outputs the output of the counter position correction unit 823 (that is, HCNT−1) when HENC [4]=0. The counter coincidence detection unit 825 outputs a coincidence signal CMR which becomes a high level by coincidence of the output RCNT of the counter circuit 3 with the output (HCNT or HCNT−1) of the selector 824 when the enabling signal OEN is at a high level. The delay circuit 826 outputs a delayed coincidence signal CMRD which is delayed by a half period of the output clock POCK from the coincidence signal CMR. In accordance with the selection signal HENC [4], the selector 827 selects and outputs the coincidence signal CMR when HENC [4]=1, and selects and outputs the delayed coincidence signal CMRD when HENC [4]=0.

The signal generation unit 83 includes a selector 831, a latch circuit 832, a delay circuit 833, and a frequency divider 834. In accordance with an output PO of the latch circuit 832, the selector 831 selects and outputs the output (CMR or CMRD) of the selector 827 when PO=0, and selects and output "1" when PO=1. The latch circuit 832 outputs an output PO obtained by latching the output of the selector 831 at the timing of a rising edge of the output clock POCK. The latch circuit 832 is reset by a high level of the DCO output POUT. The delay circuit 833 delays the output PO of the latch circuit 832 and outputs the delayed output PO as a DCO output POUT. Since the latch circuit 832 is reset by the DCO output POUT, a delay time in the delay circuit 833 becomes a pulse width of the DCO output POUT. The frequency divider 834 frequency-divides the DCO output POUT to generate a signal having a period that is twice the period of the DCO output POUT and a duty of 50% and outputs the generated signal as a second DCO output POUT2.

Figure 24:
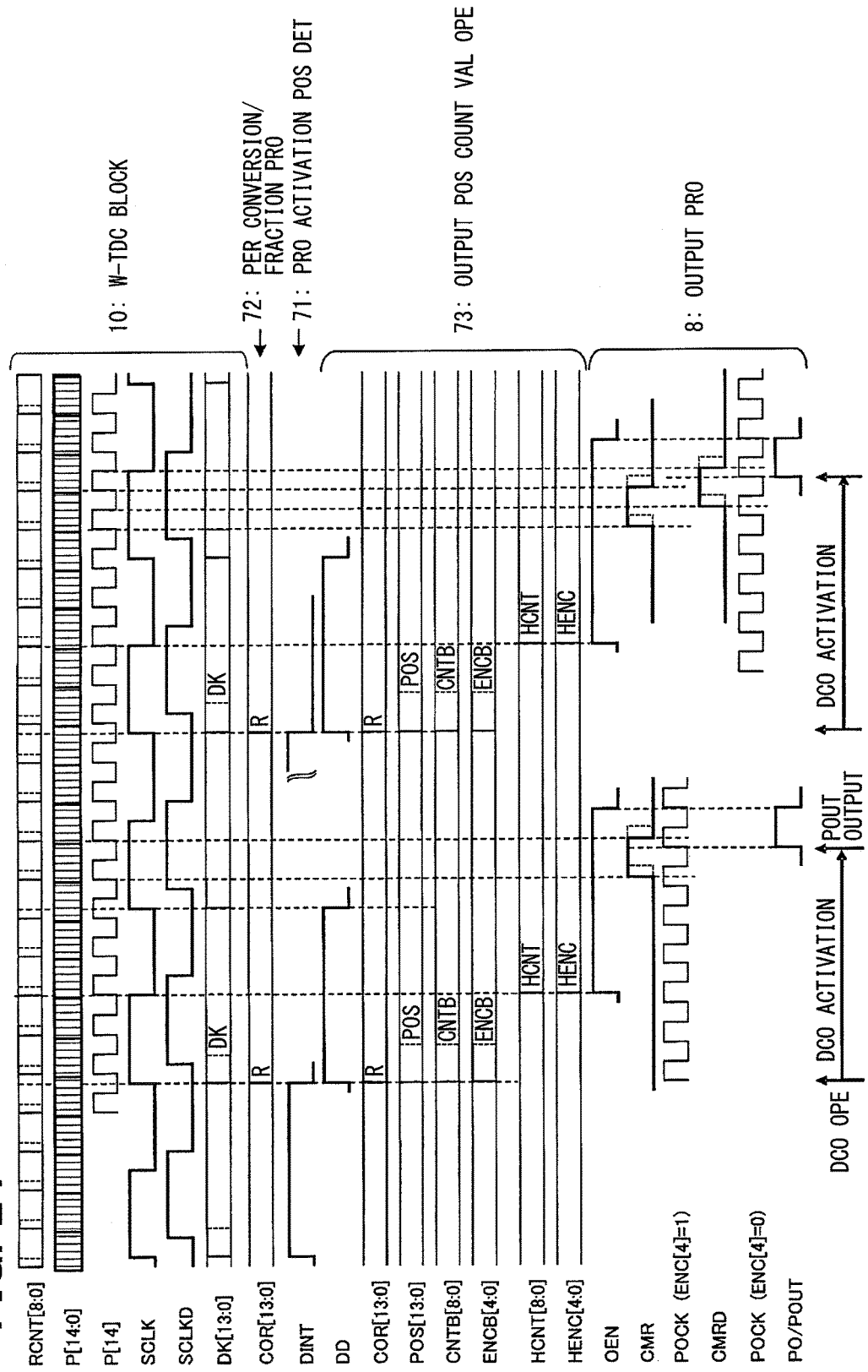

As illustrated in FIG. 24, in the output processing unit 8 configured in this manner, CMR=1 is satisfied only during a period when the RCNT coincides with the HCNT. The output PO of the latch circuit 832 and, in turn, the DCO output POUT rise at the timing of the rising edge of the output clock POCK that appears during the period of CMR=1, that is, at the timing of the output P [i] of the ring oscillator 2 corresponding to the held oscillator position HENC [4:0] that represents a fraction less than one period of the reference clock SCLK.

Figure 25:
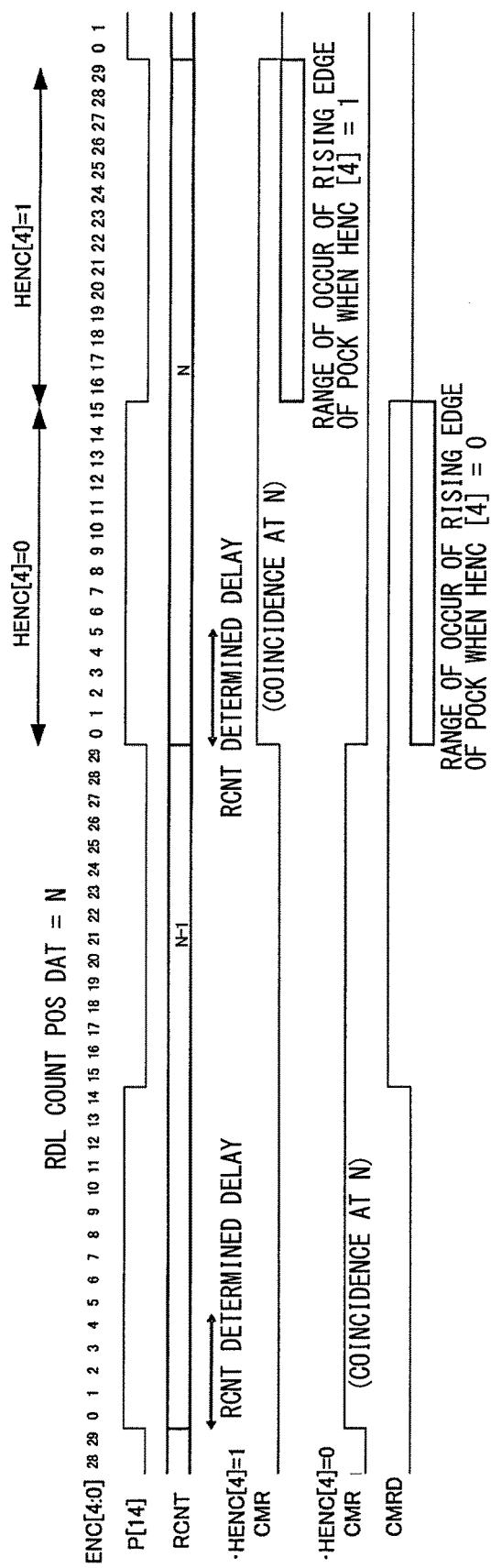
FIG. 25 is an explanatory diagram regarding the operation of a counter position correction circuit and a delay circuit.

As illustrated in FIG. 25, the output clock POCK rises at the timing of the latter half of the period of CMR=1 when HENC [4]=1 and rises at the timing of the first half of the period of CMR=1 when HENC [4]=0. However, the output RCNT [8:0] of the counter circuit 3 has a delay with respect to the output [4:0] of the ring oscillator 2. Thus, the coincidence signal CMR which is generated on the basis of the output RCNT [8:0] of the counter circuit 3 is delayed from the output clock POCK which is generated on the basis of the output P [14:0] of the ring oscillator 2. The latch circuit 832 may perform latch before a signal level of the coincidence signal CMR becomes stable by the output clock POCK generated when HENC=0 to 4 under the influence of this delay, and may not be able to correctly latch the signal level.

Thus, the output processing unit 8 uses the delayed coincidence signal CMRD which is delayed by a half period of the output clock POCK from the coincidence signal CMR when HENC [4]=0 including the period of HENC=0 to 4 so that the output clock POCK rises at the timing of the latter half of the period of CMRD=1. In this case, a timing of latching CMRD=1 is delayed by one clock of the output clock POCK. Thus, when HENC [4]=0, HCNT−1 obtained in the oscillator position correction unit 823 is used and compared to the RCNT instead of the HCNT, so that CMR=1 (in turn, CMRD=1) is output earlier by one clock of the POCK.

6. Operation

As illustrated in FIG. 24, the digital control oscillator circuit 1b configured in this manner operates the converted fraction holding value COR [13:0] during the period of DINT=1 and determines the value at the timing of the falling edge of the activation position signal DINT. Then, the counter position CNTB [8:0] and the oscillator position ENCB [4:0] representing the timing of each period of the DCO output POUT are obtained at the following timing of DD=1, and values thereof are determined (HCNT, HENC) at the timing of the falling edge of the reference clock SCLK and the OEN is allowed to satisfy OEN=1 to start the comparison between the HCNT and the RCNT. When the HCNT and the RCNT coincide with each other, CMR=1 is output for one period of P [14], and a timing of the rising edge of the output clock POCK that appears during the period of CMR=1 is used as a timing representing a period of the DCO output POUT (hereinbelow, referred to as "POUT period").

Figure 26:
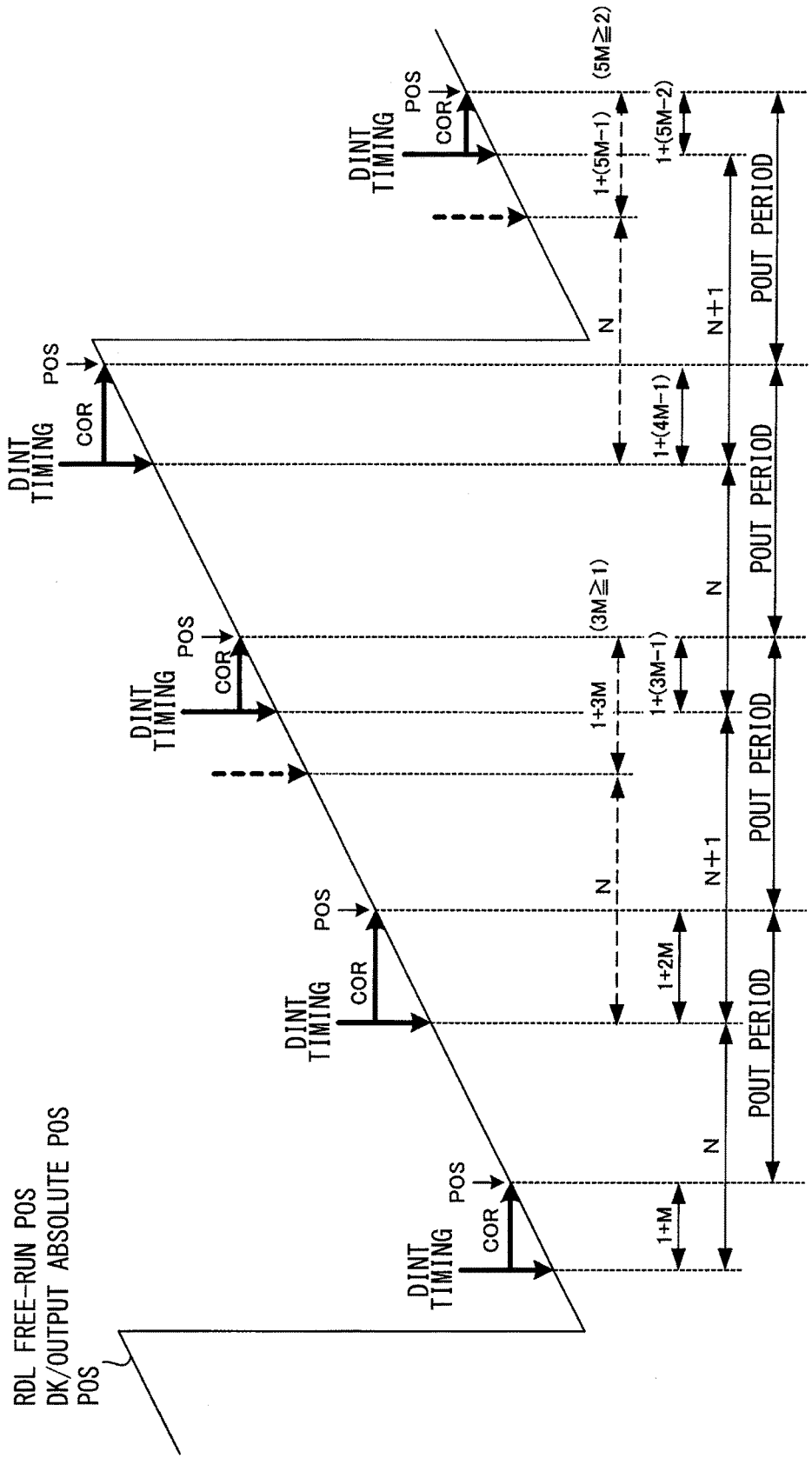
FIG. 26 is an explanatory diagram regarding the entire operation of the digital control oscillator circuit.

That is, as illustrated in FIG. 26, based on the timing of the falling edge of the activation position signal DINT (hereinbelow, referred to as "DINT timing") representing a period that is an integral multiple of the period of the reference clock SCLK (that is, a rough period timing) corresponding to the integer part CD [23:10] of the period setting value, the output absolute position POS (the counter position CNTB, the oscillator position ENCB) at a timing delayed by a time corresponding to the converted fraction holding value COR corresponding to the decimal point part [9:0] of the period setting value is obtained. Further, a timing when the output P [14:0] of the ring oscillator 2 and the output RCNT [8:0] of the counter circuit 3 coincide with the held oscillator position HENC (=ENCB) and the held counter position HCNT (=CNTB) is defined as a timing representing the POUT period.

When the POUT period is represented by N periods (N=4 in the drawing) of the reference clock SCLK and a fraction M (M=N×2/5 in the drawing) less than one period of the reference clock SCLK, the DINT timing basically occurs at every N clocks of the reference clock SCLK. When an accumulated value of fractions exceeds one clock of the reference clock SCLK (when CRDL=1), a value of one clock is subtracted from the fraction accumulated value, and, instead, the DINT timing occurs with a delay by one clock (that is, an interval of the DINT timing becomes N+1 clocks).

7. Effects

In the digital control oscillator circuit (DCO) 1b, the period of the DCO output POUT is specified by the magnification ratio with respect to the reference clock SCLK having an accurate period, a period corresponding to an integer part of the magnification ratio is represented by the count of the reference clock SCLK, and a period corresponding to a decimal point part of the magnification ratio is represented by the RDL free-run position specified by the output P [14:0] of the ring oscillator 2 and the output RCNT [8:0] of the counter circuit 3. Accordingly, accumulation of fluctuations included in the outputs of the delay elements of the ring oscillator 2 can be reduced within a certain range, and the DCO output POUT having a highly accurate and stable period can be generated regardless of the length of the period of the DCO output POUT.

The digital control oscillator circuit 1b shares the ring oscillator 2 and the counter circuit 3 with the time measurement circuit (W-TDC) 1a and performs an operation using the SCLK period operation value SCW [13:0] measured in the time measurement circuit 1a. Thus, even when an operating state of the ring oscillator varies by, for example, an environmental change, an operation for generating the DCO output POUT is executed using the SCLK period operation value SCW [13:0] corresponding to the varied state. Thus, it is possible to reduce a deterioration in the accuracy of the DCO output POUT caused by, for example, an environmental change.

8. Other Embodiments

The embodiment of the present disclosure has been described above. However, the present disclosure is not limited to the above embodiment and may employ various forms.

(1) Although, in the above embodiment, the digital control oscillator circuit 1b acquires the DK [13:0] and the SCW [13:0] from the W-TDC block 10, the present disclosure is not limited thereto. For example, one that has a configuration having only a part relating to the generation of the DK [13:0] and the SCW [13:0] of the configuration of the W-TDC block 10 may be used instead of the W-TDC block 10.

(2) In the above embodiment, the ring oscillator 2 includes the odd-number of inverter circuits, and the odd-number stage correction processing for correcting the output of the ring-oscillator into a binary number is performed on the latter stage because the output of the ring oscillator is not the power of 2. Alternatively, a ring oscillator whose output is the power of 2 may be used. In this case, the odd-number stage correction processing and the reverse odd-number correction processing can be omitted. Accordingly, the configuration of the device can be further simplified.

(3) A function of one constituent element in the above embodiment may be distributed to a plurality of constituent elements, or functions of a plurality of constituent elements may be integrated to one constituent element. At least a part of the configuration of the above embodiment may be replaced with a known configuration having the same function. A part of the configuration of the above embodiment may be omitted. At least a part of the configuration of the above embodiment may be, for example, added to or replaced with the configuration of another embodiment described above.

(4) In addition to the digital control oscillator circuit described above, the present disclosure can be achieved in various forms such as various system including the digital control oscillator circuit as a constituent element.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A digital control oscillator circuit comprising:
a ring oscillator having a plurality of delay elements that delay a pulse signal and are connected in series in a ring shape;
a counter circuit that counts the number of circulations of the pulse signal in the ring oscillator;
a rough period generation unit that: acquires a period setting value represented as a magnification ratio with respect to a period of a predetermined reference clock; counts the reference clock using an integer part of the magnification ratio as a count value; and generates a rough period timing of each period represented by the integer part;
a fraction conversion unit that converts a decimal point part of the magnification ratio into the number of stages of the delay elements passed by the pulse signal, and generates a fraction; and
an output processing unit that:
selects a timing when each of an output of the ring oscillator and an output of the counter circuit becomes a value corresponding to the fraction generated by the fraction conversion unit as an output timing when a time corresponding to the fraction has passed after the rough period timing; and
generates an output signal oscillating at a period represented by the period setting value according to the output timing.

2. The digital control oscillator circuit according to claim 1, wherein:
the output processing unit:
separates the fraction to a counter position representing a value corresponding to the output of the counter circuit and an oscillator position representing a value corresponding to the output of the ring oscillator; and
selects, as the output timing, an edge of a signal output by one of the delay elements corresponding to the oscillator position immediately after the output of the counter circuit coincides with an output count value.

3. The digital control oscillator circuit according to claim 1, wherein:
the fraction conversion unit:
accumulates and adds a value of the decimal point part at each rough period timing to obtain an addition result;
generates, as the fraction, a result obtained by subtracting the reference period value from the addition result when the addition result is in a carry state in which the addition result exceeds a reference period value corresponding to the period of the reference clock; and
generates, as the fraction, the addition result when the addition result is not in the carry state; and
the rough period generation unit increments the count value by one only when the fraction conversion unit is in the carry state.

4. The digital control oscillator circuit according to claim 3, further comprising:
a reference period encoding unit that encodes the period of the predetermined reference clock by the number of stages of the delay elements passed by the pulse signal.

5. The digital control oscillator circuit according to claim 4, further comprising:
a measurement target encoding unit that performs encoding a measurement start timing and a measurement finish timing of a measurement period determined by a measurement target signal input asynchronously with the reference clock in accordance with the number of stages of the delay elements passed by the pulse signal during a period between a predetermined activation timing and the measurement start timing and a period between the activation timing and the measurement finish timing;
a count unit that counts the number of periods of the reference clock included in the measurement target period;
a fraction operation unit that:
obtains a preceding fraction representing a time difference between the measurement start timing and the reference timing that appears first after the measurement start timing based on an encoding result in the reference period encoding unit and the measurement target encoding unit using a timing of each period of the reference clock as a reference timing;
obtains a following fraction representing a time difference between the measurement finish timing and the reference timing that appears first after the measurement finish timing based on an encoding result in the reference period encoding unit and the measurement target encoding unit using a timing of each period of the reference clock as a reference timing; and
obtains fraction data representing a difference between a period obtained by multiplying a period of the reference timing by a count value in the count unit and the measurement target period according to the preceding fraction and the following fraction; and
a measurement value output unit that outputs the count value in the count unit and the fraction data as a measurement value representing a length of the measurement target period.

* * * * *